(12) United States Patent
Seo et al.

(10) Patent No.: US 8,513,677 B2
(45) Date of Patent: Aug. 20, 2013

(54) DISPLAY DEVICE HAVING AN ALUMINUM COMPLEX OXIDE ON METAL LAYER FOR IMPROVING CORROSION RESISTANCE

(75) Inventors: Jong-Hyun Seo, Seoul (KR); Mun-Pyo Hong, Seongnam-si (KR); Nam-Seok Roh, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 1731 days.

(21) Appl. No.: 11/378,799

(22) Filed: Mar. 16, 2006

(65) Prior Publication Data

US 2007/0218601 A1    Sep. 20, 2007

(51) Int. Cl.
*H01L 29/26* (2006.01)
(52) U.S. Cl.
USPC .......... 257/79; 257/81; 257/95; 257/98; 257/E21.28; 257/E29.273; 257/E51.005
(58) Field of Classification Search
USPC ........... 257/79, 81, 95, 98, E21.28, E29.273, 257/E51.005
See application file for complete search history.

(56) References Cited

U.S. PATENT DOCUMENTS

| | | | | |
|---|---|---|---|---|
| 3,066,054 A | * | 11/1962 | McNamara | 148/244 |
| 5,296,421 A | * | 3/1994 | Nishida et al. | 501/105 |
| 5,900,446 A | * | 5/1999 | Nishihara et al. | 524/127 |
| 6,156,409 A | * | 12/2000 | Doushita et al. | 428/143 |

FOREIGN PATENT DOCUMENTS

| | | |
|---|---|---|
| JP | 2001-264806 | 9/2001 |
| KR | 2001-0097215 | 11/2001 |

OTHER PUBLICATIONS

Patent Abstracts of Japan, Publication No. 2001-264806, Sep. 26, 2001, 1 p.
Korean Patent Abstracts, Publication No. 1020010097215, Nov. 8, 2001, 1 p.
Osenbach, J.S. and Zell, J.L., Silicon-Based Polymers, IEEE Transactions Components Hybrids Manufacturing Technology, 1.6, 350-359 (1993).
Petrunin, M.A., et al., Oxyalkylsiloxane Thin Film on the Aluminum Oxide Layer, 143, 251-257 (1996).
Tao, Yu-Tai, et al., Self-assembled Monolayers of n-alkanate, Journal of American Chemical Society, 118, 6724-6735 (1996).
White, H.W., et al., Production of a Protective Thin Film on Aluminum Using Aqueous Solution of Methyl Phosphonic Acid, Journal of Electrochemical Society, 132, 773-780 (1985).

* cited by examiner

*Primary Examiner* — Thanh V Pham
(74) *Attorney, Agent, or Firm* — Innovation Counsel LLP

(57) ABSTRACT

A thin film transistor substrate for a liquid crystal display device includes a substrate, a metal layer on the substrate, and an aluminum complex oxide layer on the metal layer. The aluminum complex oxide layer comprises at least one selected from the group consisting of zirconium, tungsten, chromium and molybdenum. A passivation layer is formed on the aluminum complex oxide layer through a dipping process.

3 Claims, 40 Drawing Sheets

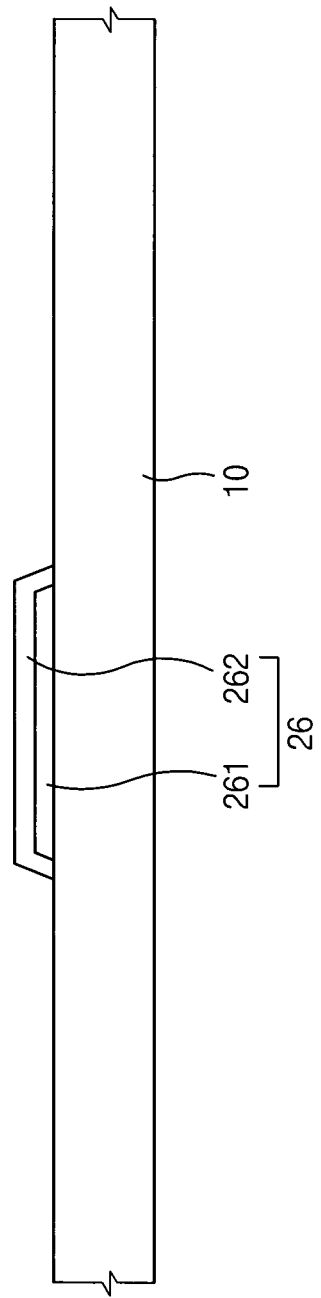

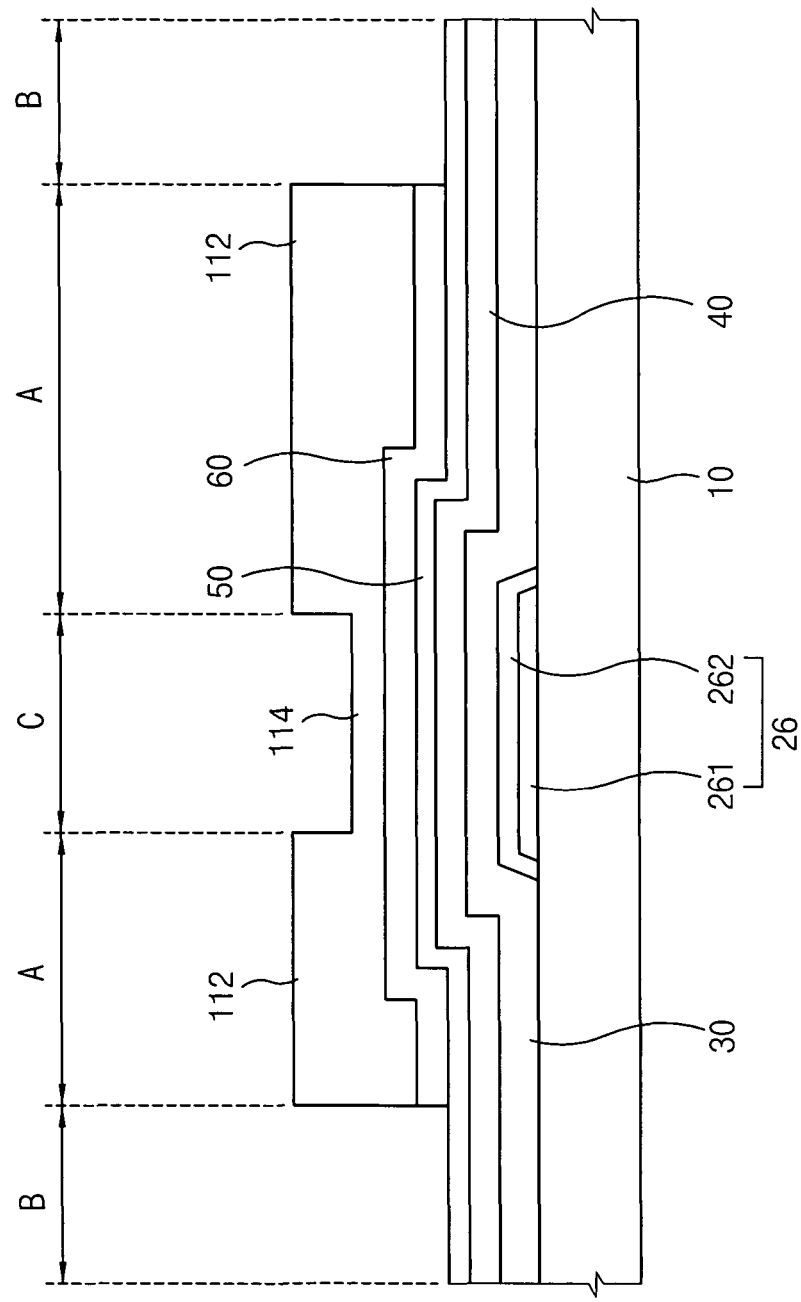

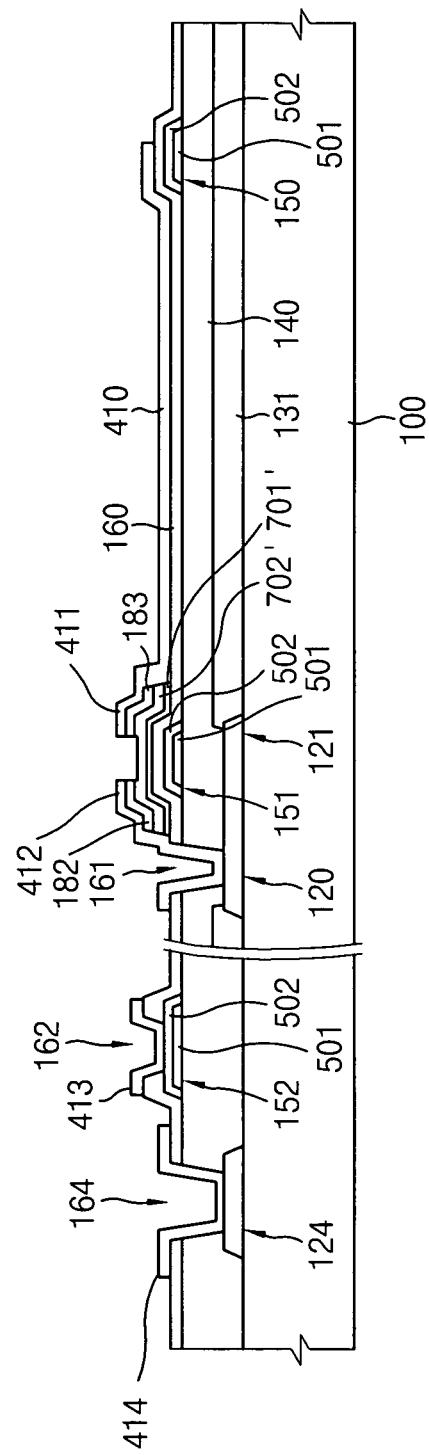

DISPLAY DEVICE HAVING AN ALUMINUM COMPLEX OXIDE ON METAL LAYER FOR IMPROVING CORROSION RESISTANCE

BACKGROUND OF THE INVENTION

1. Field of the Invention

The present invention relates to a thin film transistor (TFT) substrate for use in a liquid crystal display (LCD) device and a method of manufacturing the TFT substrate. More particularly, the present invention relates to a TFT substrate for an LCD device having improved corrosion resistance, and a method of manufacturing the TFT substrate.

2. Description of the Related Art

A display device, in general, converts electrical signals into images perceivable by a viewer. Types of display devices include: a liquid crystal display (LCD) device; an organic light emitting display (OLED) device; and a plasma display panel (PDP). Arrangement of liquid crystals of an LCD device is varied in response to application of an electric field, and light transmittance of the liquid crystals is changed to display an image.

Gate resistance of a thin film transistor (TFT) used in a large screen LCD device is kept small to prevent a delay of the electric signal which would be seen as a flicker of the image. Examples of metals used for gate lines in an LCD device include copper and aluminum. However, use of copper and aluminum presents problems in the manufacture of the LCD devices. The copper has a lower electrical resistance than the aluminum. The adhesive strength between the copper and a substrate is small, and additionally copper is corrosive. Also copper easily diffuses into a silicon substrate.

A material for the line having improved ohmic contact characteristics has been developed to improve characteristics of the TFT. A conventional gate line has a double layer structure of AlNd/Cr. The aluminum has various characteristics such as low resistance and high electrical conductivity. However, the adhesive strength of aluminum is small, and aluminum is corrosive.

Corrosion of the aluminum line is divided into two types which include galvanic corrosion and an electrolytic dissolution. Galvanic corrosion is formed between two different metals. The electrolytic dissolution is formed in an electrolyte. Corrosion deteriorates the lines of the LCD device.

In order to reduce the corrosion of the aluminum line, a passivation layer such as silicon nitride film is deposited on the line. However, if a pin hole forms in the passivation layer, electrolytic dissolution is formed through the pin hole. Pin holes are formed as the result of evaporation of impurities during the deposition of the silicon nitride film, or cracks of the passivation layer due to the step difference of the underlying layer. Electrolytic dissolution can quickly result in a short of the line.

FIG. 1 is a cross-sectional view showing a defect of a silicon nitride passivation layer on an aluminum layer.

Referring to FIG. 1, a chromium layer pattern 111 and an aluminum/neodymium alloy layer pattern 112 are on a substrate 100. A silicon nitride layer 120 is stacked on the aluminum/neodymium alloy layer pattern 112. A pin hole 121 has formed in the silicon nitride layer 120 so that the aluminum/neodymium alloy layer pattern 112 is partially exposed through the pin hole 121. The exposed aluminum/neodymium alloy layer pattern 112 is corroded.

Conventionally, in order to prevent the corrosion of the line, an aluminum oxide layer is formed on the line using aluminum anodizing process through an electrochemical treatment. The aluminum oxide layer resists a voltage applied to a data line. An aluminum oxide layer having a compact structure has a growth speed of about 14 Å/V. A thickness of an aluminum oxide layer that resists a voltage of more than about 5V is about 80 Å to about 100 Å. The aluminum oxide layer is formed using a non-aqueous solution. A conventional non-aqueous solution for the aluminum oxide layer includes ethylene glycol of about 89 wt %, water of about 10 wt % and ammonium tartarlate or ammonium salicylate of about 1wt %.

In the electrochemical method, the oxide layer is formed before patterning of the line or after patterning of the line. When the oxide layer is formed before the patterning of the line, the oxide layer is not easily patterned. In addition, when the oxide layer is formed after the patterning of the line, the aluminum neodymium alloy layer is easily detached from the chromium layer, and an additional process of partially etching the oxide layer for electrically connecting an indium tin oxide layer is required. Furthermore, an additional power supply is required to apply an electric potential to the substrate in a solution, thereby increasing the manufacturing processes required to produce the LCD device.

Suitable techniques for forming the passivation layer are described in references such as: (1) Y. T. Tao, G. D. Hietpas and D. L. Allara, Self-assembled Monolayers of n-alkanate, Journal of American Chemical Society, 118, 6724 (1996); (2) M. A. Purinin, A. P. Nazarov and Y. N. Mikhailovski, Oxyalkylsiloxane Thin Film on the Aluminum Oxide Layer, 143, 251 (1996); (3) J. S. Osenbach and J. L. Zell, Silicon-Based Polymers, IEEE Transactions Components Hybrids Manufacturing Technology, 1.6, 350 (1993); (4) H. W. White, C. D. Crowder and G. P. Alldredge, Production of a Protective Thin Film on Aluminum Using Aqueous Solution of Methyl Phosphonic Acid, Journal of Electrochemical Society, 132, 773 (1985).

In the above-mentioned methods, a non-metal passivation layer is formed on the aluminum layer. However, when a high voltage of about 3V to about 5V is applied to the line, the non-metal passivation layer does not resist the high voltage. In addition, the additional patterning process is required to partially remove the non-metal passivation layer.

SUMMARY OF THE INVENTION

The present invention provides a thin film transistor (TFT) substrate for a liquid crystal display (LCD) device, which is capable of improving a corrosion resistance.

The present invention also provides a method of manufacturing the above-mentioned TFT substrate.

A thin film transistor substrate for a liquid crystal display device in accordance with one embodiment of the present invention includes a substrate, a metal layer and an aluminum complex (or composite) oxide layer. The metal layer is positioned on the substrate. The aluminum complex oxide layer is positioned on the metal layer. The aluminum complex oxide layer comprises at least one selected from the group consisting of zirconium, tungsten, chromium and molybdenum, and the metal layer comprises aluminum or aluminum alloy.

A method of manufacturing a thin film transistor substrate for a liquid crystal display device in accordance with one aspect of the present invention is provided as follows. A metal layer is formed on a substrate. An aluminum complex oxide layer is formed on the metal layer. The aluminum complex oxide layer is formed by applying to the metal layer a coating solution including at least one selected from the group consisting of zirconium, tungsten, chromium and molybdenum. In one embodiment the application is achieved by dipping the substrate having the metal layer in the coating solution. In one embodiment, the coating solution comprises a nitric acid.

A method of manufacturing a thin film transistor substrate for a liquid crystal display device in accordance with another aspect of the present invention is provided as follows. A gate wire layer is formed on a substrate. The gate wire layer is patterned to form a gate wire including a gate line, a gate pad and a gate electrode. An aluminum complex oxide layer is formed on the gate wire. A gate insulating layer is formed on the substrate having the gate wire. A semiconductor pattern and an ohmic contact pattern are formed on the gate insulating layer. A data wire is formed on the substrate having the semiconductor pattern and the ohmic contact pattern. The data wire includes a data line crossing the gate line, a data pad electrically connected to the data line, a source electrode on the gate line and electrically connected to the data line, and a drain electrode on an opposite side of the source electrode with respect to the gate electrode. A protective layer is formed on the substrate having the data wire. The protective layer and the gate insulating layer are patterned to form contact holes through which the gate pad, the data pad and the drain electrode are partially exposed, respectively. A transparent conductive layer is formed on the protective layer. The transparent conductive layer is patterned to form an auxiliary gate pad electrically connected to the gate pad, an auxiliary data pad electrically connected to the data pad and a pixel electrode electrically connected to the drain electrode.

A method of manufacturing a thin film transistor substrate for a liquid crystal display device in accordance with still another embodiment of the present invention is provided as follows. A gate wire layer is formed on a substrate. The gate wire layer is patterned to form a gate wire including a gate line, a gate pad and a gate electrode. An aluminum complex oxide layer is formed on the gate wire. A gate insulating layer is formed on the substrate having the gate wire. A semiconductor layer, an ohmic contact layer and a conductive layer are formed on the gate insulating layer. Photoresist patterns having various thicknesses are formed on the conductive layer. The semiconductor layer, the ohmic contact layer and the conductive layer are partially removed using the photoresist patterns as a mask to form a data wire, an ohmic contact pattern and a semiconductor pattern. The data wire includes a data line, a data pad electrically connected to the data line, a source electrode and a drain electrode. A protective layer is formed on the substrate having the data wire, the ohmic contact pattern and the semiconductor pattern. The protective layer and the gate insulating layer are patterned to form contact holes through which the gate pad, the data pad and the drain electrode are partially exposed, respectively. A transparent conductive layer is formed on the protective layer. The transparent conductive layer is patterned to form an auxiliary gate pad electrically connected to the gate pad, an auxiliary data pad electrically connected to the data pad and a pixel electrode electrically connected to the drain electrode.

A method of manufacturing a thin film transistor substrate for a liquid crystal display device in accordance with still another aspect of the present invention is provided as follows. A data wire is formed on a substrate. Red, green and blue color filters are formed on the substrate having the data wire. A buffer layer is formed on the substrate having the red, green and blue color filters. A gate wire layer is formed on the buffer layer. The gate wire layer is partially etched to form a gate wire including a gate line and a gate electrode. An aluminum complex oxide layer is formed on the gate wire. A gate insulating layer is formed on the substrate having the gate wire. A semiconductor pattern is formed on the gate insulating layer and an ohmic contact pattern on the semiconductor pattern and a first contact hole in the gate insulating layer and the buffer layer through which the data line is partially exposed. The semiconductor pattern and the ohmic contact pattern have an island shape. A source electrode and a drain electrode are formed on the gate insulating layer having the semiconductor pattern and the ohmic contact pattern. A transparent conductive layer is deposited on the substrate having the source and drain electrodes to partially etch the transparent conductive layer to form a pixel wire electrically connected to the drain electrode. A portion of the ohmic contact pattern between the source and drain electrodes is removed so that the ohmic contact pattern is divided into two ohmic contact portions.

According to the present invention, the complex oxide film is formed on the metal line, which may be an aluminum line, through a chemical conversion coating process in order to decrease corrosion of the metal line in the event that the protective layer includes a defect.

BRIEF DESCRIPTION OF THE DRAWINGS

The above and other advantages of the present invention will become more apparent by describing in detail exemplary embodiments thereof with reference to the accompanying drawings, in which:

FIGS. 15A to 22B are cross-sectional views showing a method of manufacturing the TFT substrate for the LCD device shown in FIG. 12;

FIGS. 25 to 32 are cross-sectional views showing a method of manufacturing the TFT substrate for the LCD device shown in FIG. 24.

DESCRIPTION OF THE EMBODIMENTS

Figure 1:
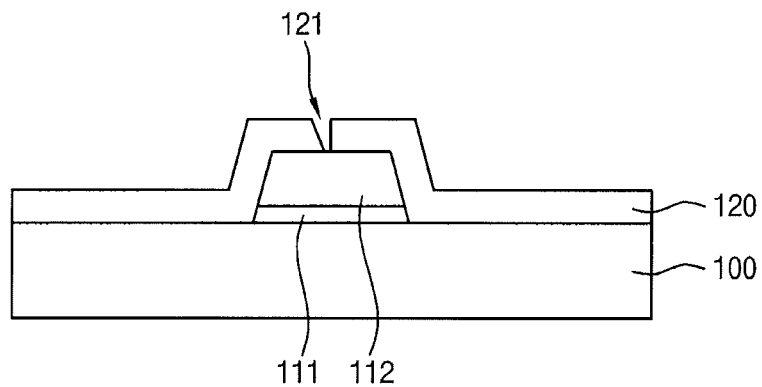
FIG. 1 is a cross-sectional view showing a defect in a silicon nitride passivation layer on an aluminum layer.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to"another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to nonimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

A passivation layer is formed on an aluminum layer through a chemical conversion method to prevent a corrosion of the aluminum layer. The passivation layer is formed using a chemical conversion coating solution having metal ions after the aluminum layer is formed. The passivation layer includes an aluminum complex oxide layer.

In the present invention, a triple layer structure having an aluminum layer, an aluminum complex oxide layer and a silicon nitride layer is formed on the substrate. That is, a double layer passivation having the aluminum complex oxide layer and the silicon nitride layer is formed on the aluminum layer. Therefore, the aluminum layer is not exposed although a pin hole (221 of FIG. 2) is formed on the silicon nitride layer.

The chemical conversion coating solution may include zirconium, tungsten, chromium, molybdenum. In addition, the chemical conversion coating solution may further include nitric acid. For example, the chemical conversion coating solution may include a $Na_2ZrO_4$ solution. Referring to Reaction Equation 1, the $Na_2ZrO_4$ solution when reacted with the aluminum forms a complex oxide.

$$2Al+2Na_2ZrO_4 \rightarrow Al_2O_3.ZrO_2.2Na_2O \qquad \text{Reaction Equation 1}$$

That is, the complex oxide forms a complex oxide layer to protect the aluminum layer. When the aluminum is exposed to an air, an aluminum oxide thin layer is formed on the aluminum. When the aluminum oxide thin layer is dipped in the chemical conversion coating solution, the aluminum oxide thin layer is dissolved in the chemical conversion coating solution to form the complex oxide. Alternatively, the chemical conversion coating solution may be used for an aluminum alloy layer including AlNd, a double layer structure including a metal layer and an aluminum layer on the metal layer. The silicon nitride layer is then formed on the complex oxide layer to complete the double layer passivation layer.

Figure 2:
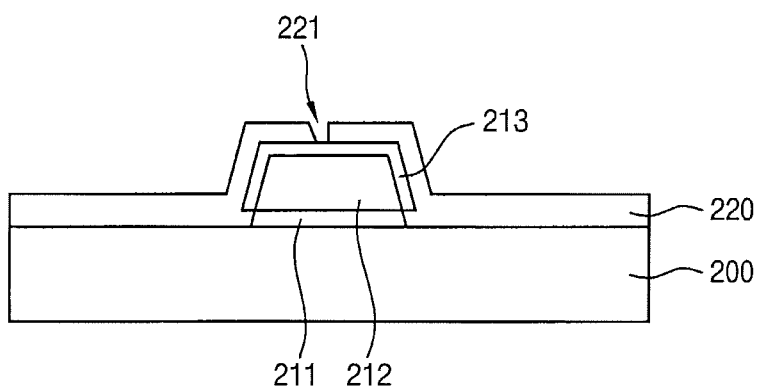
FIG. 2 is a cross-sectional view showing a line structure having an aluminum layer and an aluminum alloy oxide layer on the aluminum layer in accordance with one embodiment of the present invention.

FIG. 2 is a cross-sectional view showing a line structure having an aluminum layer and an aluminum alloy oxide layer on the aluminum layer in accordance with one embodiment of the present invention.

Referring to FIG. 2, a chromium layer pattern 211 is on a substrate 200, and an aluminum/neodymium alloy layer pattern 212 is on the chromium layer pattern 211. An aluminum complex oxide layer 213 is on the aluminum/neodymium alloy layer pattern 212. A silicon nitride layer 220 is on the substrate 200 having the chromium layer pattern 211, the aluminum/neodymium alloy layer pattern 212 and the aluminum complex oxide layer 213. Therefore, the aluminum/neodymium alloy layer pattern 212 will not be exposed to air although a pin hole 221 is on the silicon nitride layer 220.

In FIG. 2, the aluminum/neodymium alloy layer pattern 212 is formed, and then dipped in a chemical conversion coating solution to form the aluminum complex oxide layer 213. Alternatively, an aluminum/neodymium alloy layer (not shown) is dipped in the chemical conversion coating solution to form a protection layer (not shown), and the aluminum/neodymium alloy layer (not shown) and the protection layer (not shown) are patterned to form the aluminum/neodymium alloy layer pattern 212 and the aluminum complex oxide layer 213.

FIGS. 3A to 3D are cross-sectional views showing a method of manufacturing the line structure shown in FIG. 2.

Figure 3A:
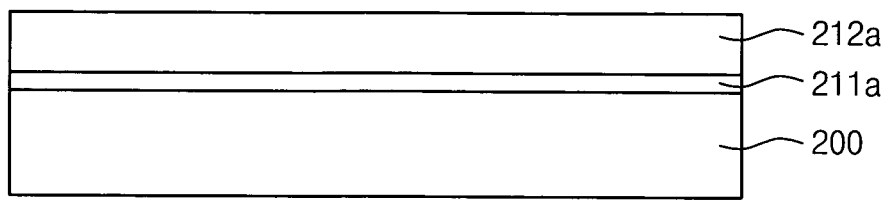
FIGS. 3A to 3D are cross-sectional views showing a method of manufacturing the line structure shown in FIG. 2.

Referring to FIG. 3A, a chromium layer 211a is formed on the substrate 200. Alternatively, a copper layer or a tungsten layer may be formed on the substrate 200. The substrate 200 may be a glass substrate. The aluminum/neodymium alloy layer 212a is formed on the chromium layer 211a. Alternatively, an aluminum layer or an aluminum alloy layer may be formed on the chromium layer 211a. In addition, the chromium layer 211a may be omitted so that the aluminum/neodymium alloy layer 212a may be directly formed on the substrate 200.

Figure 3B:
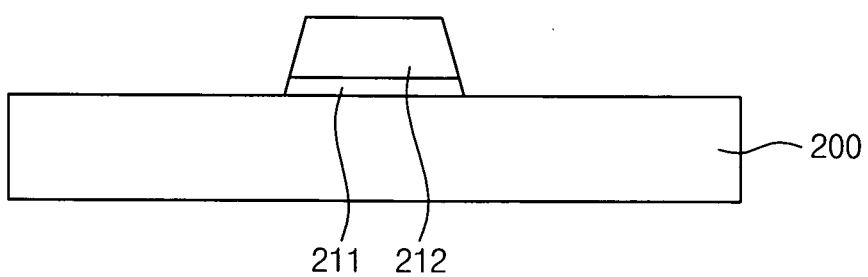

Referring to FIGS. 3A and 3B, the chromium layer 211a and the aluminum/neodymium alloy layer 212a are partially etched to form the chromium layer pattern 211 and the aluminum/neodymium alloy layer pattern 212.

Figure 3C:
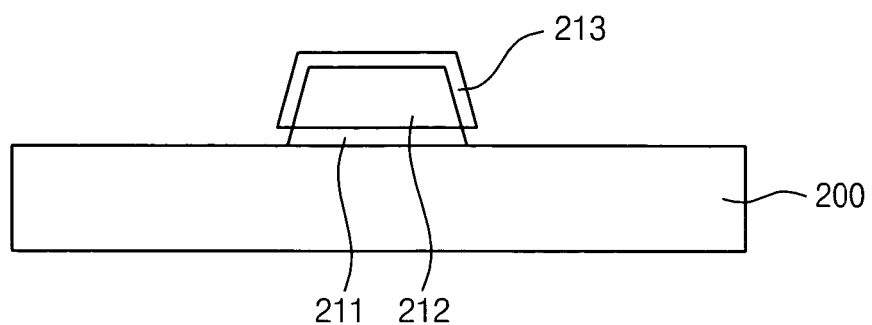

Referring to FIG. 3C, the substrate 200 is dipped in the chemical conversion coating solution that includes zirconium, tungsten, chromium or molybdenum. These can be used alone or in a mixture. The chemical conversion coating solution may further include a nitric acid. The aluminum of the aluminum/neodymium alloy layer pattern 212 reacts with the metal of the chemical conversion coating solution to form the aluminum complex oxide layer 213.

Figure 3D:
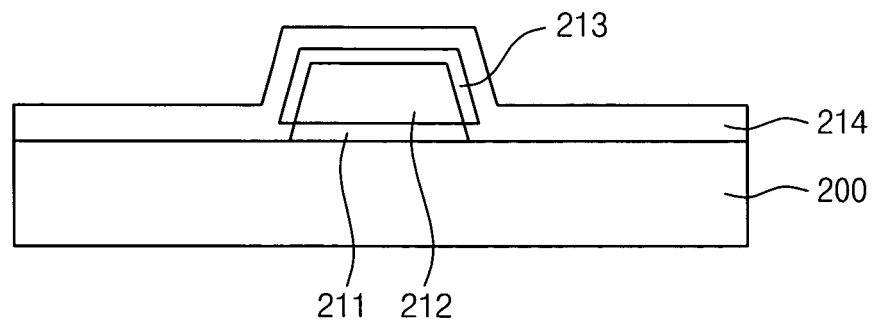

Referring to FIG. 3D, the silicon nitride is deposited on the substrate 200 having the chromium layer pattern 211, the aluminum/neodymium alloy layer pattern 212 and the aluminum complex oxide layer 212. Therefore, the double layer passivation layer having the aluminum complex oxide layer 213 and the silicon nitride layer 214 is formed on the aluminum/neodymium alloy layer pattern 212 to protect the aluminum/neodymium alloy layer pattern 212. Therefore, the aluminum of the aluminum/neodymium alloy layer pattern 212 will not be exposed to the air although the pin hole (221 shown in FIG. 2) is formed on the silicon nitride layer 214.

The test results of the complex oxide layer to analyze a composition of the complex oxide layer are described below.

Figure 4A:
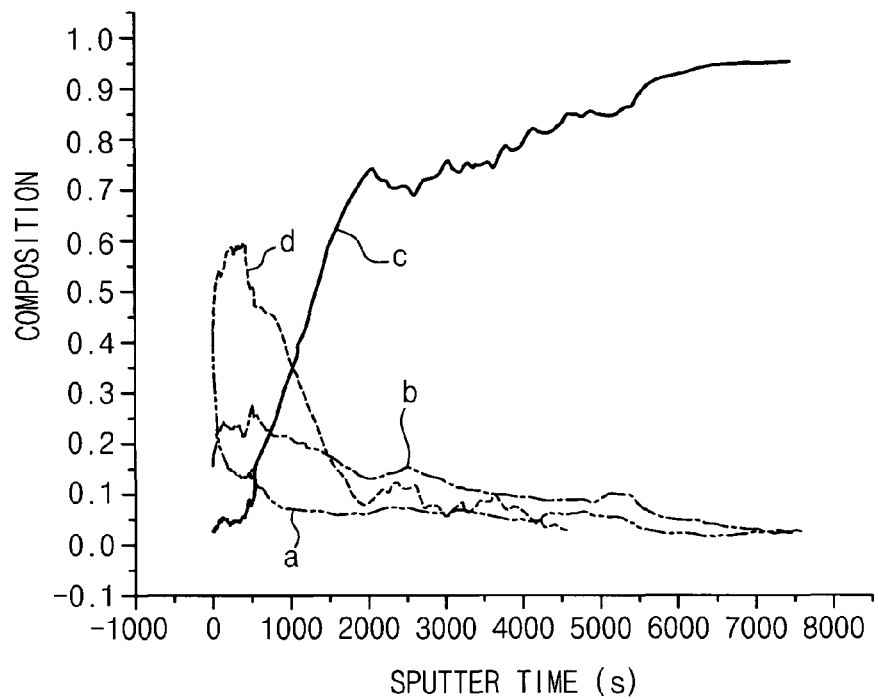
FIGS. 4A and 4B are graphs showing a relationship between a composition and a sputter time of auger electron spectroscopy (AES) spectra for chemical conversion coatings on pure aluminum thin films in accordance with one embodiment of the present invention.
Figure 4B:
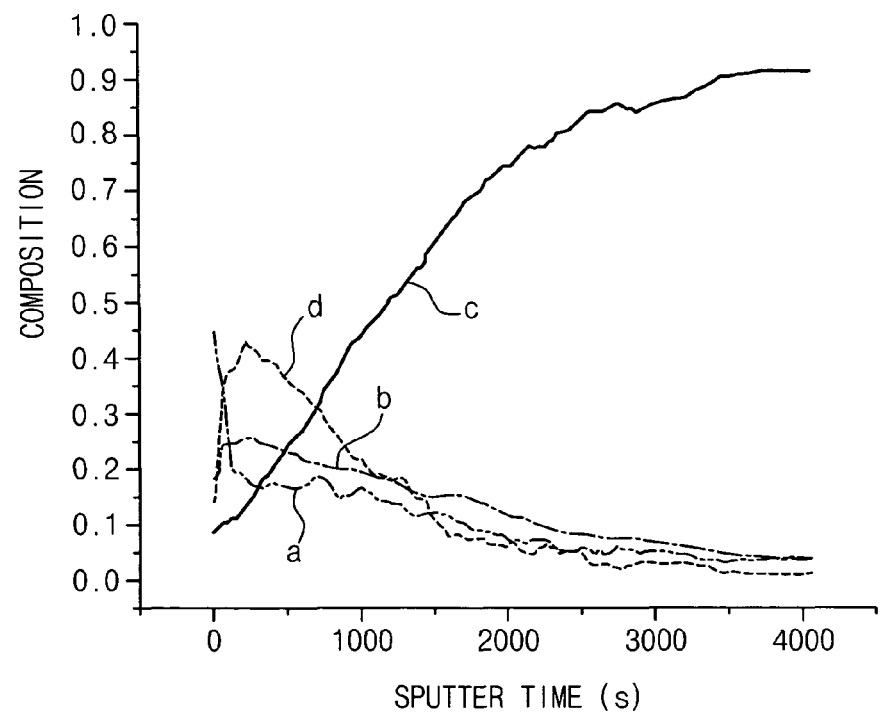

A pure aluminum layer was formed on a glass substrate for a TFT substrate at a thickness of about 4,000 Å through a sputtering process. A complex oxide layer was formed using a chemical conversion coating solution including zirconium or tungsten. FIGS. 4A and 4B are graphs showing a relationship between a composition and a sputter time of auger electron spectroscopy (AES) spectra for chemical conversion coatings on pure aluminum thin films in accordance with one embodiment of the present invention.

Referring to FIG. 4A, reference numerals 'a', 'b', 'c' and 'd' represent carbon, oxygen, aluminum and zirconium, respectively. The complex oxide layer includes the zirconium. An amount of the zirconium in the complex oxide layer is decreased, as a distance from a surface of the complex oxide layer is increased.

Referring to FIG. 4B, reference numerals 'a', 'b', 'c' and 'd' represent carbon, oxygen, aluminum and tungsten, respectively. The complex oxide layer includes the tungsten. An amount of the tungsten in the complex oxide layer is decreased, as a distance from a surface of the complex oxide layer is increased.

The test results of the aluminum layer to analyze a corrosion of the aluminum layer covered by the complex oxide layer are described below.

Figure 5:
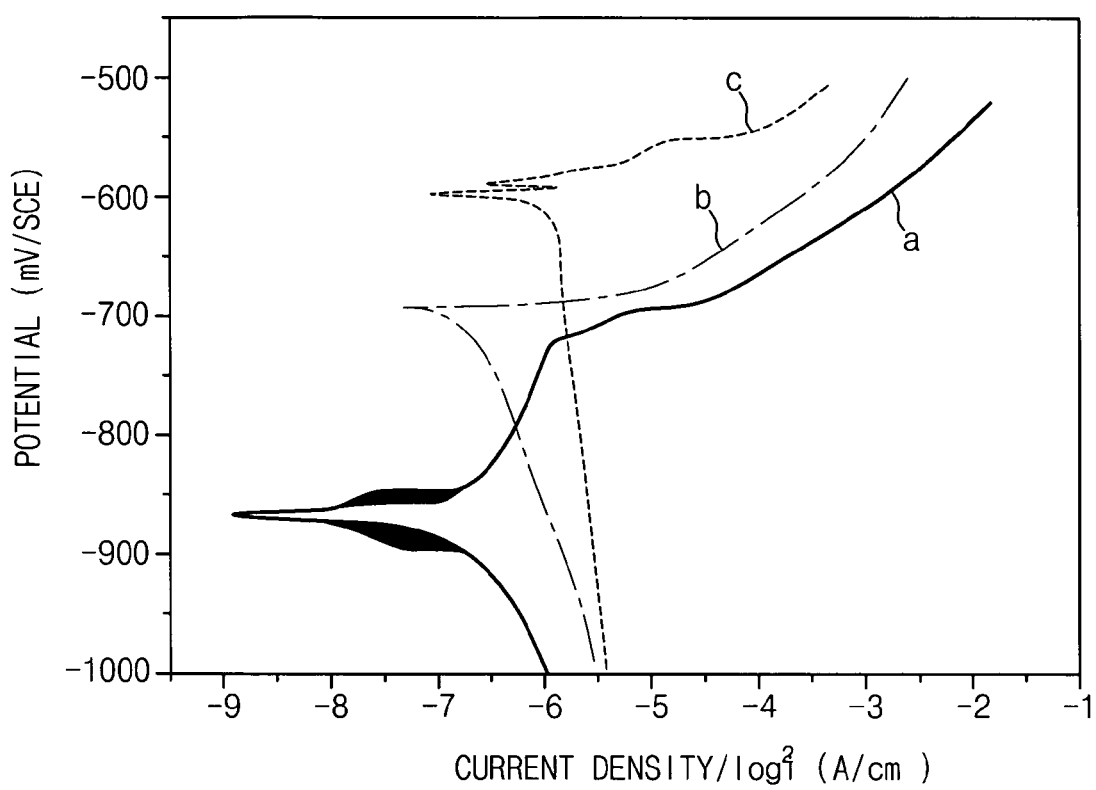
FIG. 5 is a graph showing a potential and a current density of thin films in accordance with one embodiment of the present invention.

A pure aluminum layer was formed on a glass substrate for a TFT substrate at a thickness of about 4,000 Å. An aluminum complex oxide layer was formed using a chemical conversion coating solution including zirconium or tungsten. The aluminum layer was dipped in 0.5M NaCl solution, and a potentiodynamic test was performed on the aluminum layer. When a potential of erosion is high and a current density is low, a material is resistant to the erosion. FIG. 5 is a graph showing a potential and a current density of thin films in accordance with one embodiment of the present invention. Reference numerals 'a', 'b' and 'c' represent a pure aluminum layer without a passivation layer, the aluminum layer covered by the complex oxide layer including the tungsten and the aluminum layer covered by the complex oxide layer including the zirconium, respectively.

Referring to FIG. 5, the pure aluminum layer 'a' without the passivation layer has lower potential and higher current density than the aluminum layer 'b' covered by the complex oxide layer including the tungsten and the aluminum layer 'c' covered by the complex oxide layer including the zirconium. That is, the aluminum layers 'b' and 'c' covered by the complex oxide layers are greatly resistant to the corrosion than the pure aluminum layer 'a'. In the pure aluminum layer 'a', when the potential is about −0.5V, the current density is about several miliampheres. However, in the aluminum layers 'b' and 'c' covered by the complex oxide layers, the current density is about tens of μA. That is, the current density is greatly decreased by repassivation characteristics of the zirconium or the tungsten of the complex oxide layer.

An optically tested pit density of the aluminum layers 'b' and 'c' covered by the complex oxide layers is about ½ to about ⅕ of that of the pure aluminum layer 'a'. Table 1 represents a pitting potential and a pit density of the pure aluminum layer, the aluminum layer covered by the complex oxide layer including the tungsten and the aluminum layer covered by the complex oxide layer including the zirconium.

| Samples | Pitting Potential (mV/SCE) | Number of Pit Density ($10^4/m^2$) |
| --- | --- | --- |
| pure Al layer | −740 | 5 |
| Al with W conversion coating | −680 | 25 |
| Al with Zr conversion coating | −600 | 1 |

The aluminum complex oxide layer includes metal ions to have an electrical conductivity so that the aluminum complex oxide layer may not be removed. That is, an indium tin oxide layer may be electrically connected to the aluminum layer through the aluminum complex oxide layer. Alternatively, the aluminum complex oxide layer may be partially removed so that the aluminum layer makes direct contact with the indium tin oxide layer. The aluminum complex oxide layer may be partially etched using an etching solution including chromium oxide and phosphoric acid at a temperature of about 60° C. to about 100° C. Alternatively, the aluminum complex oxide layer may be partially etched using nitric acid, or sodium hydroxide. The aluminum complex oxide layer may also be partially etched through a dry etching process.

A line structure having the double layer passivation layer can be used for a semiconductor device, or a liquid crystal display (LCD) device. For example, a gate line or a data line of the LCD device may include the line structure having the double layer passivation layer.

Hereinafter, a thin film transistor (TFT) substrate having the line structure including the complex oxide layer and a method of manufacturing the TFT substrate are described.

Figure 6:
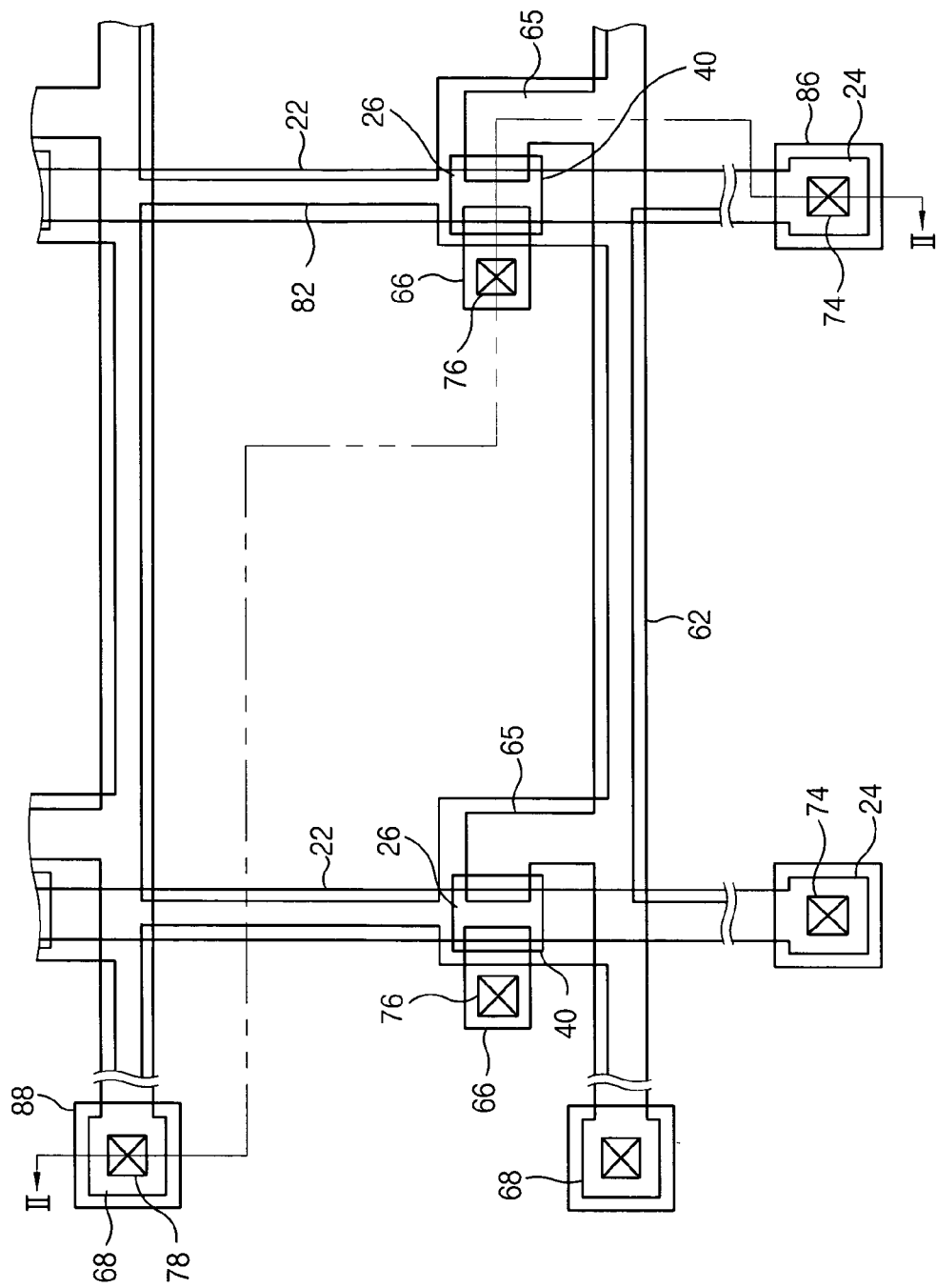
FIG. 6 is a plan view showing a thin film transistor (TFT) substrate for a liquid crystal display (LCD) device in accordance with one embodiment of the present invention.
Figure 7:
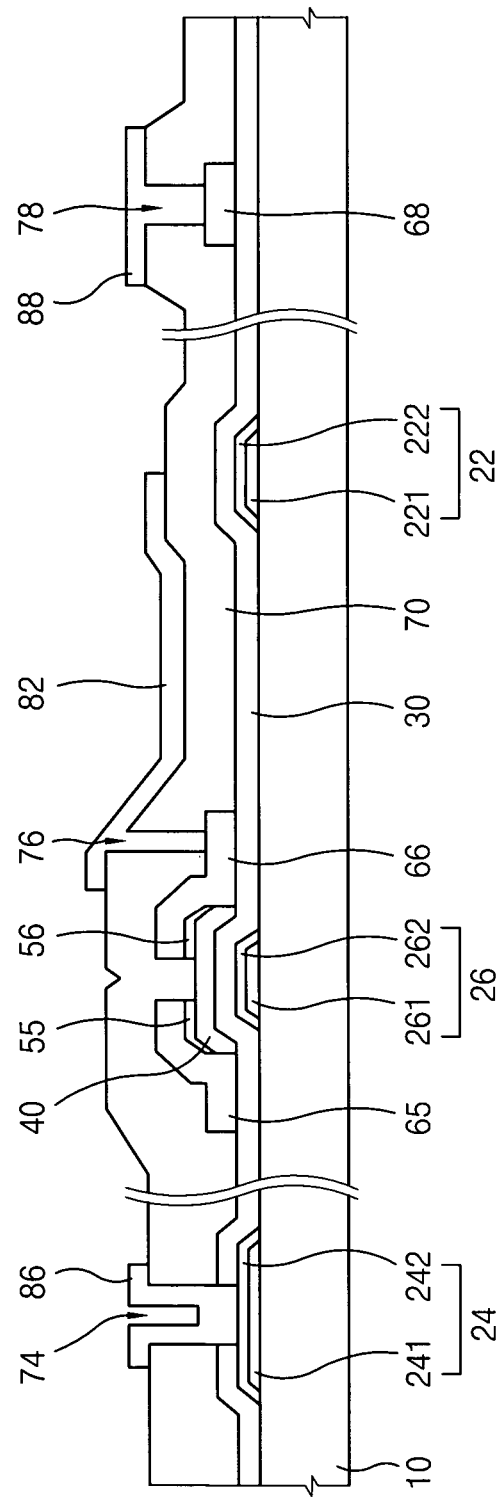
FIG. 7 is a cross-sectional view taken along a line II-II' shown in FIG. 6.

FIG. 6 is a plan view showing a thin film transistor (TFT) substrate for a liquid crystal display (LCD) device in accordance with one embodiment of the present invention. FIG. 7 is a cross-sectional view taken along a line II-II' shown in FIG. 6.

Referring to FIGS. 6 and 7, a gate wire is on an insulating substrate 10. The gate wire 22, 24 and 26 has a double layer structure including a gate wire layer 221, 241 and 261 and a passivation layer 222, 242 and 262 having an aluminum complex oxide layer. The gate wire layer 221, 241 and 261 may include a first gate wire layer and a second gate wire layer on the first gate wire layer. Examples of a metal that can be used for the first gate wire layer include aluminum/neodymium alloy, or chromium. Examples of a metal that can be used for the second gate wire layer include aluminum, or aluminum alloy. The gate wire 22, 24 and 26 includes a gate line 22, a gate pad 24 and a gate electrode 26 of a thin film transistor (TFT). The gate line 22 extends in a horizontal direction of the insulating substrate 10. An externally provided gate signal is applied to the gate line 22 through the gate pad 24. The gate electrode 26 is electrically connected to the gate line 22.

A gate insulating layer 30 is on the insulating substrate 10 having the gate wire 22, 24 and 26. Examples of insulating material that can be used of the gate insulating layer 30 include silicon nitride, or silicon oxide.

A semiconductor layer 40 is on the gate insulating layer 30 corresponding to the gate electrode 24. The semiconductor layer 40 has an island shape. An ohmic contact layer 54 and 56 is on the semiconductor layer 40. The ohmic contact layer 54 and 56 includes N+ amorphous silicon that is formed by implanting N+ impurities at a high concentration.

A data wire 62, 65, 66 and 68 is on the ohmic contact layer 54 and 56 and the gate insulating layer 30. The data wire 62, 65, 66 and 68 includes a data line 62, a source electrode 65, a data pad 68 and a drain electrode 66. The data line 62 is extended in a longitudinal direction of the insulating substrate 10, and crosses the gate line 22 to define a pixel. The source electrode 65 is electrically connected to the data line 62, and on a portion of the ohmic contact layer 54. An image signal is applied to the data line 62 through the data pad 68. The drain electrode 66 is spaced apart from the source electrode 65, and on a remaining portion of the ohmic contact layer 56. A protective layer 70 is on the data wire 62, 65, 66 and 68 and the semiconductor layer 40.

Contact holes 76 and 78 are on the protective layer 70 corresponding to the drain electrode 66 and the data pad 68, respectively. Another contact hole 74 through which the gate pad 24 is partially exposed is on the gate insulating layer 30 and the protective layer 70. The contact holes 74 and 78 through which the gate pad 24 and the data pad 68 are partially exposed may have various shapes having an area of about 0.5 mm×15 µm to about 2 mm×60 µm.

A pixel electrode 82 is on the protective layer 70. The pixel electrode 82 is electrically connected to the drain electrode 66 through the contact hole 76. An auxiliary gate pad 86 and an auxiliary data pad 88 are on the protective layer 70. The auxiliary gate pad 86 is electrically connected to the gate pad 24 through the contact hole 74. The auxiliary data pad 88 is electrically connected to the data pad 68 through the contact hole 78. Each of the pixel electrode 82, the auxiliary gate pad 86 and the auxiliary data pad 88 may include a transparent conductive material. Examples of the transparent conductive material that can be used for the pixel electrode 82, the auxiliary gate pad 86 and the auxiliary data pad 88 include indium tin oxide (ITO), or indium zinc oxide (IZO).

In FIGS. 6 and 7, the pixel electrode 82 partially overlaps the gate line 22 to form a storage capacitor that maintains a voltage difference between the pixel electrode 82 and a common electrode. Alternatively, a storage capacitor line (not shown) may be formed on a same layer as the gate wire 22, 24 and 26.

The pixel electrode 82 may overlap with the data line 62 to increase an opening rate of the pixel. Although the pixel electrode 82 overlaps with the data line 62, a dielectric constant of the protective layer 70 is low to decrease a parasitic capacitance between the pixel electrode 82 and the data line 62.

A method of manufacturing the TFT substrate for the LCD device is described below. FIGS. 8 to 11 are cross-sectional views showing a method of manufacturing the TFT substrate for the LCD device shown in FIG. 7.

Figure 8:
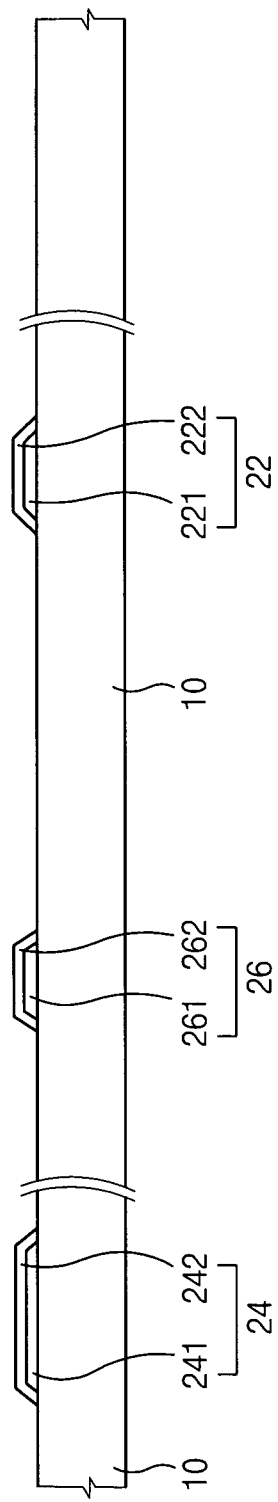
FIGS. 8 to 11 are cross-sectional views showing a method of manufacturing the TFT substrate for the LCD device shown in FIG. 7.

Referring to FIGS. 6 to 8, the gate wire layer 221, 241 and 261 that includes aluminum, or aluminum alloy is formed on the insulating substrate 10. The substrate 10 having the gate wire layer 221, 241 and 261 is dipped in a chemical conversion coating solution to form aluminum complex oxide layer 222, 242 and 262. The chemical conversion coating solution may include zirconium, tungsten, chromium, or molybdenum. Therefore, the gate wire having the gate line 22, the gate electrode 26 and the gate pad 24 is formed on the insulating substrate 10.

Figure 9:
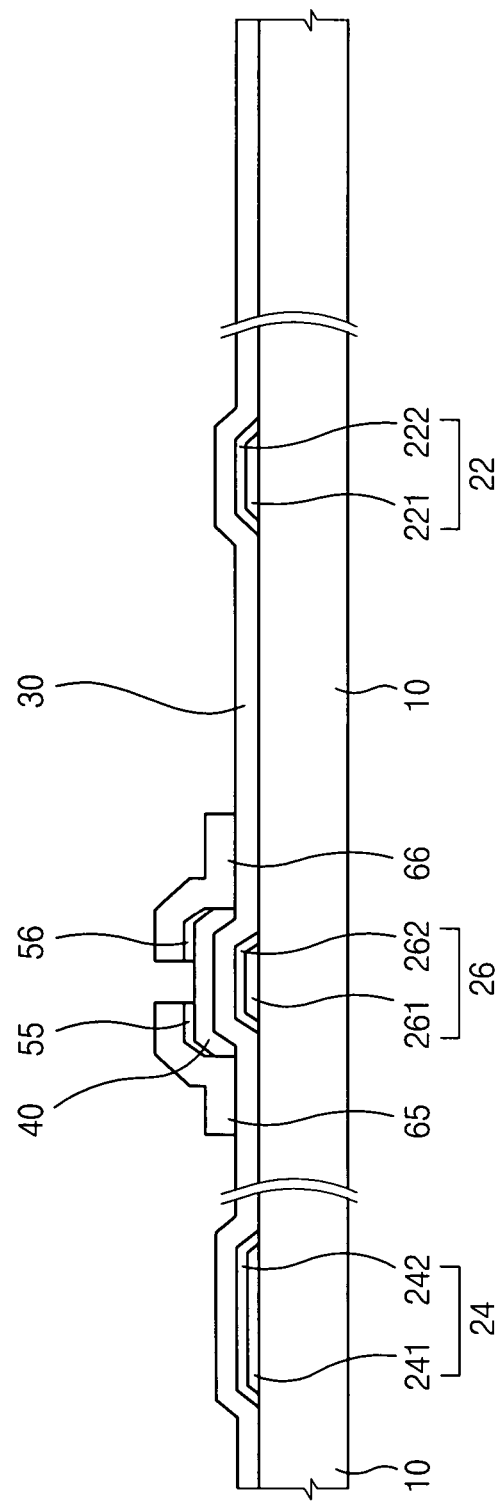

Referring to FIGS. 6, 7 and 9, the gate insulating layer 30 is formed on the insulating substrate 10 having the gate wire 22, 24 and 26. A semiconductor layer 40 is formed on the gate insulating layer 30. An impurity implanted amorphous silicon layer is formed on the semiconductor layer 40. The semiconductor layer 40 and the impurity implanted amorphous silicon layer are patterned to form the semiconductor layer 40 and the ohmic contact layer 55 and 56 having the island shape.

Figure 10:
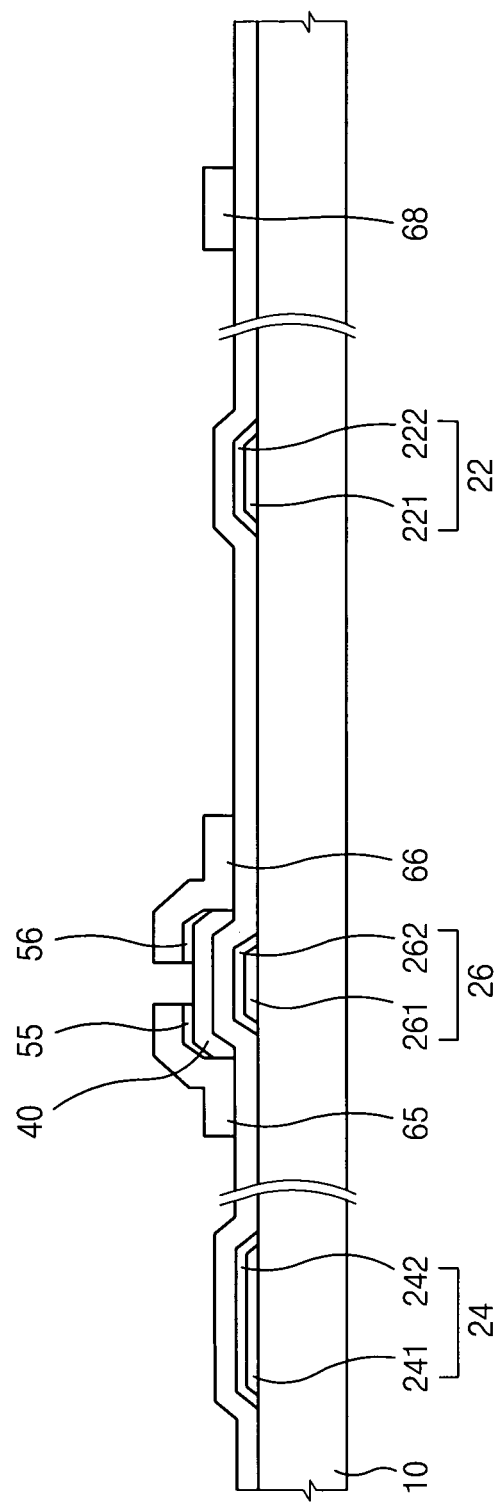

Referring to FIGS. 6, 7 and 10, a metal layer for forming the data wire is deposited on the gate insulating layer 30 having the semiconductor layer 40 and the ohmic contact layer 55 and 56. Examples of a metal that can be used for the data wire include aluminum, chromium, chromium/nickel alloy, or molybdenum/nickel alloy. In FIG. 10, the metal layer includes the aluminum or the aluminum alloy. The metal layer is then dipped in the chemical conversion coating solution to form the aluminum complex oxide layer.

The metal layer is partially etched to form the data line 62, the source electrode 65, the data pad 68 and the drain electrode 66. The data line 62 crosses the gate line 22. The source electrode 65 is electrically connected to the data line 62, and on the gate electrode 26. The data pad 68 is electrically connected to an end portion of the data line 62. The drain electrode 66 is spaced apart from the source electrode 64, and on the gate electrode 26.

Figure 11:
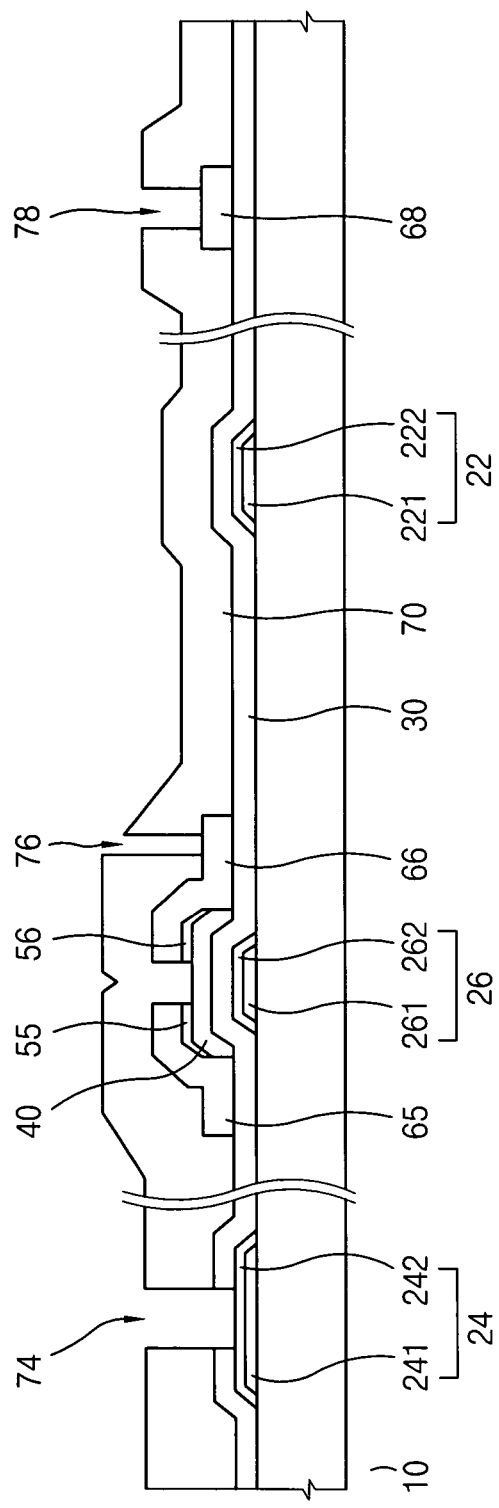

The impurity implanted amorphous silicon layer is partially removed so that a portion of the semiconductor pattern 40 between the source electrode 65 and the drain electrode 66 is exposed. For example, the semiconductor layer 40 may be exposed through oxygen plasma to stabilize the semiconductor layer 40. Referring to FIGS. 6, 7 and 11, a protective layer 70 is then formed on the substrate 10 having the semiconductor layer 40, the source electrode 65 and the drain electrode 66.

The protective layer 70 and the gate insulating layer 30 are patterned through a photolithography process to form the contact holes 74, 76 and 78 through which the gate pad 24, the drain electrode 66 and the data pad 68 are partially exposed, respectively. A portion of the aluminum complex oxide layer corresponding to the contact holes 74, 76 and 78 may be removed through an etching process. Alternatively, the etching process for removing the portion of the aluminum complex oxide layer may be omitted. For example, the aluminum complex oxide layer may be etched using the etching solution including chromium oxide or phosphoric acid. Alternatively, the aluminum complex oxide layer may be etched using the etching solution including nitric acid or sodium hydroxide. The aluminum complex oxide layer may be etched through the dry etching process. The contact holes 74, 76 and 78 may have various shapes. The contact holes 74 and 78 through which the gate pad 24 and the data pad 68 are partially exposed may have an area of about 0.5 mm×15 μm to about 2 mm×60 μm.

A transparent conductive layer is formed on the protective layer 70 having the contact holes 74, 76 and 78. The transparent conductive layer is partially etched to form the pixel electrode 82, the auxiliary gate pad 86 and the auxiliary data pad 88. The pixel electrode 82, the auxiliary gate pad 86 and the auxiliary data pad 88 are electrically connected to the drain electrode 66, the gate pad 24 and the data pad 68 through the contact holes 76, 74 and 78, respectively. Before forming the transparent conductive layer, the substrate 10 having the protective layer 70 may be pre-heated using a nitrogen gas to prevent an oxidation of the gate pad 24, the drain electrode 66 and the data pad 68 that are exposed through the contact holes 76, 74 and 78, respectively.

In FIGS. 8 to 11, the TFT substrate is manufactured using five masks. Alternatively, the TFT substrate may be manufactured using four masks.

Figure 12:
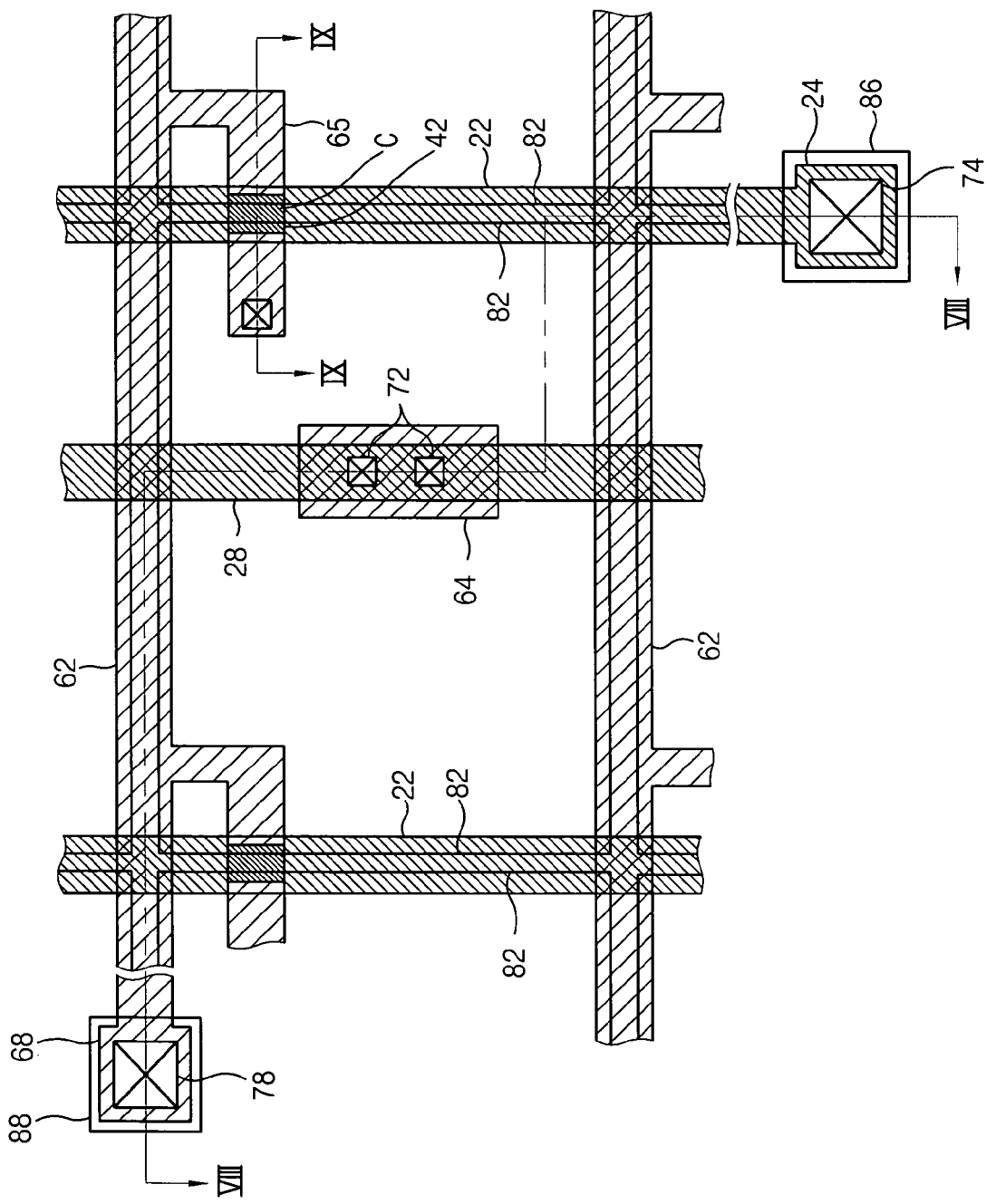
FIG. 12 is a plan view showing a TFT substrate for an LCD device in accordance with another embodiment of the present invention.
Figure 13:
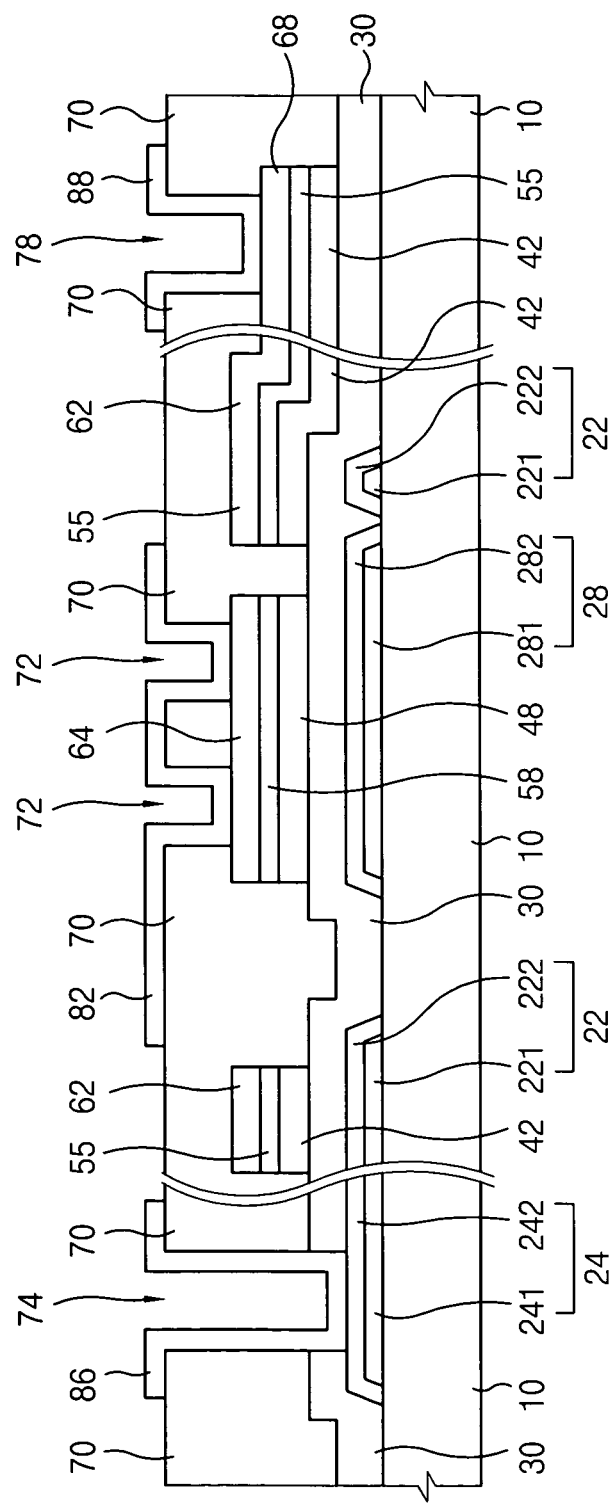
FIG. 13 is a cross-sectional view taken along a line VII-VII' shown in FIG. 12.
Figure 14:
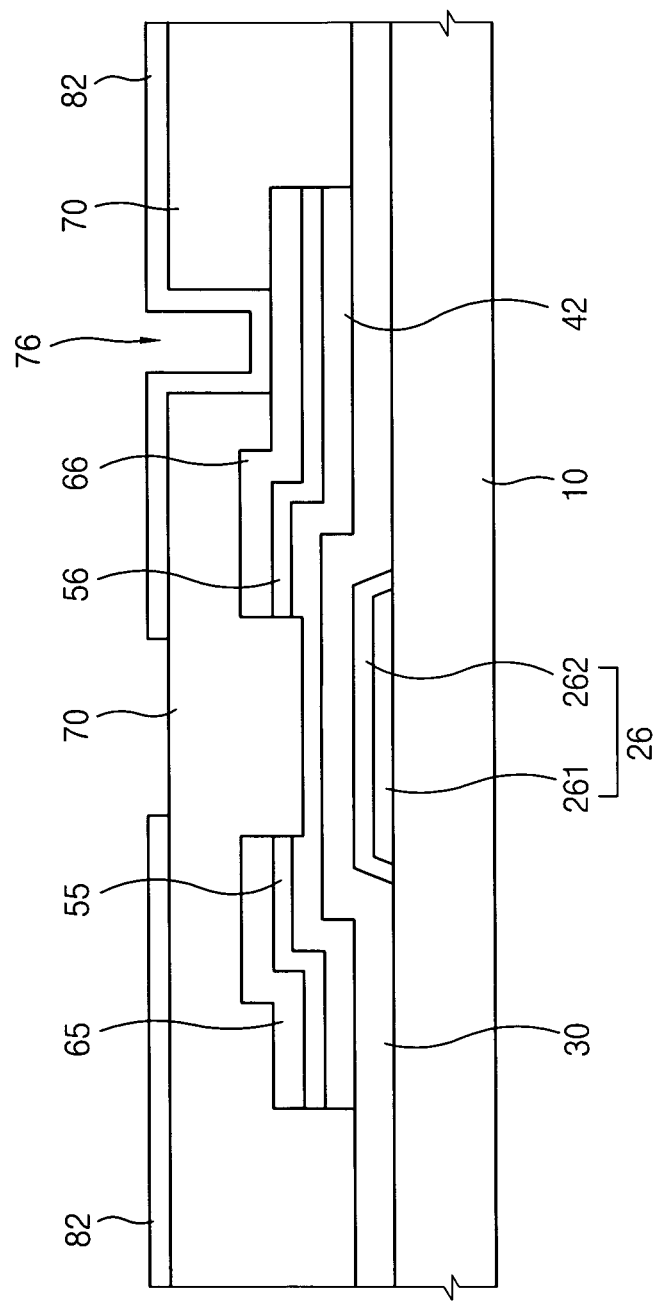
FIG. 14 is a cross-sectional view taken along a line IX-IX' shown in FIG. 12.
Figure 15A:
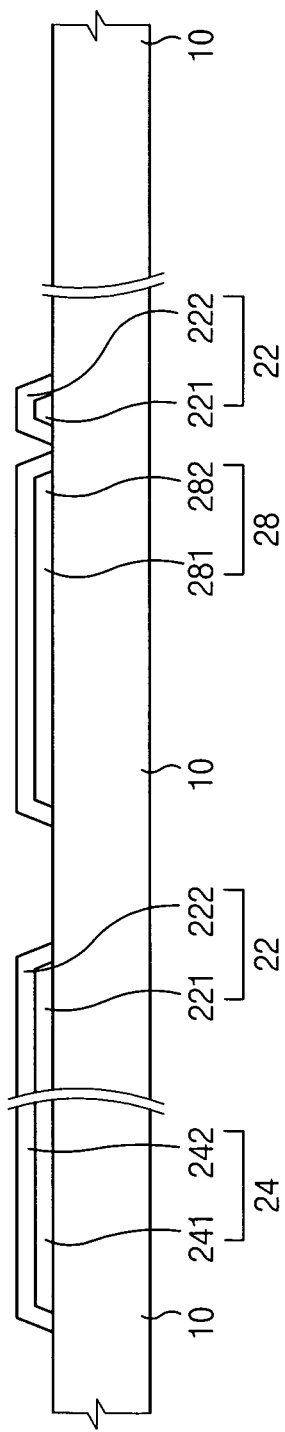
Figure 16A:
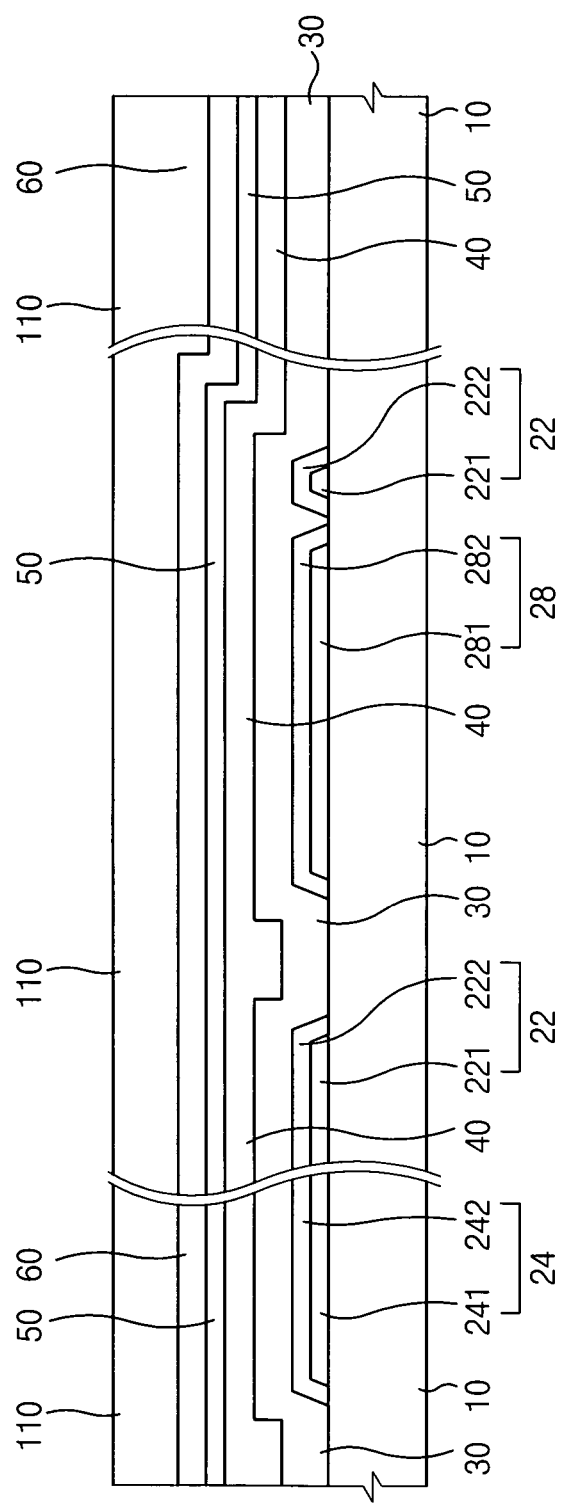
Figure 16B:
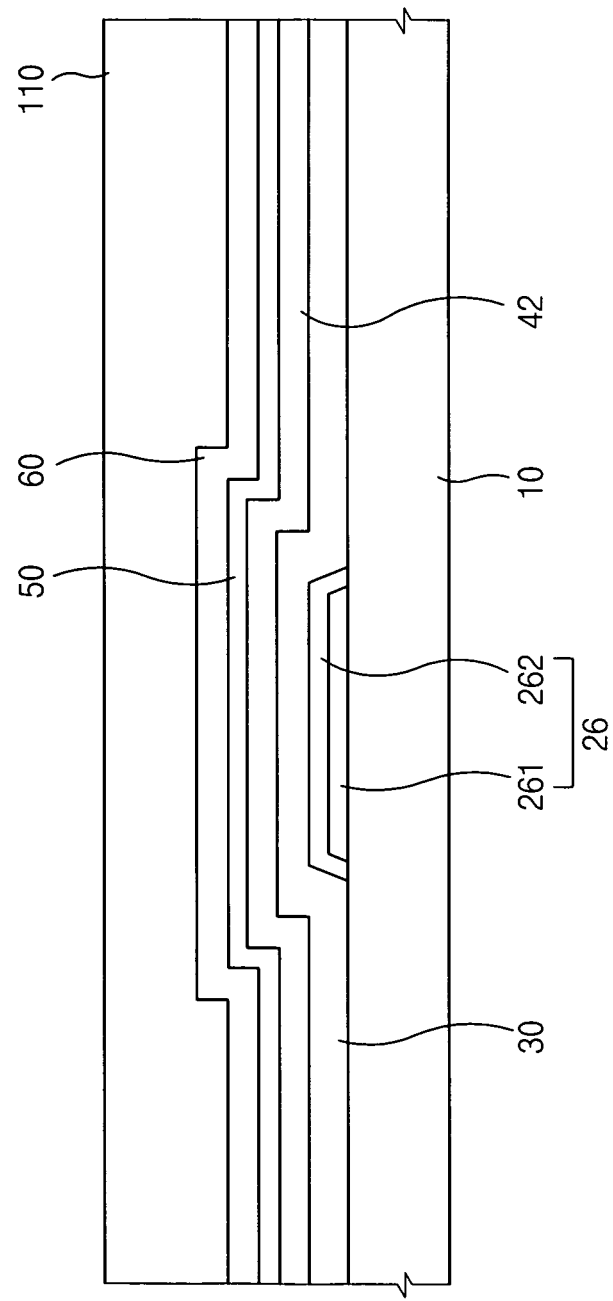

FIG. 12 is a plan view showing a TFT substrate for an LCD device in accordance with another embodiment of the present invention. FIG. 13 is a cross-sectional view taken along a line VII-VII' shown in FIG. 12. FIG. 14 is a cross-sectional view taken along a line IX-IX' shown in FIG. 12.

Referring to FIGS. 12 to 14, a gate wire is on an insulating substrate 10. The gate wire 22, 24 and 26 includes a gate wire layer 221, 241 and 261 and an aluminum complex oxide layer 222, 242 and 262. The gate wire layer 221, 241 and 261 may include an aluminum or an aluminum/neodymium alloy. The gate wire 22, 24 and 26 includes a gate line 22, a gate pad 24 and a gate electrode 26.

A storage capacitor line 28 is on the insulating substrate 10 in substantially parallel with the gate line 22. The storage capacitor line 28 has a substantially same material and on a substantially same layer as the gate wire. That is, the storage capacitor line 28 includes an aluminum or aluminum/neodymium alloy layer, and an aluminum complex oxide layer. The storage capacitor line 28 is overlapped with a conductive pattern 68 for a storage capacitor to form the storage capacitor that maintains a voltage difference between the pixel electrode 82 and a common electrode. Alternatively, the storage capacitor line 28 may be omitted, and the pixel electrode 82 may be overlapped with the gate line 22. A common voltage may be applied to the storage capacitor line 28.

A gate insulating layer 30 is on the insulating substrate 10 having the gate wire 22, 24 and 26 and the storage capacitor line 28 to cover the gate wire 22, 24 and 26 and the storage capacitor line 28. Examples of insulating material that can be used of the gate insulating layer 30 include silicon nitride, or silicon oxide.

Semiconductor patterns 42 and 48 are on the gate insulating layer 30. Ohmic contact patterns 55, 56 and 58 are on the semiconductor patterns 42 and 48. The ohmic contact patterns 55, 56 and 58 include N+ amorphous silicon that is formed by implanting N+ impurities at a high concentration. For example, phosphor may be implanted to an upper portion of the semiconductor patterns 42 and 48 to form the ohmic contact patterns 55, 56 and 58.

A data wire 62, 64, 65, 66 and 68 is on the ohmic contact patterns 55, 56 and 58 and the gate insulating layer 30. The data wire 62, 64, 65, 66 and 68 includes a data line member 62, 65 and 68, a drain electrode 66 of a thin film transistor (TFT) and the conductive pattern 64 for the storage capacitor. The data line member 62, 65 and 68 includes a data line 62, a data pad 68 and a source electrode 65. The data line 62 is extended in a longitudinal direction of the insulating substrate 10. An externally provided image signal is applied to the data line 62 through the data pad 68. The source electrode 65 is electrically connected to the data line 62, and on a portion of the ohmic contact pattern 55. The drain electrode 66 is spaced apart from the source electrode 65, and on a remaining portion of the ohmic contact pattern 55. The conductive pattern 64 for the storage capacitor corresponds to the storage capacitor line 28. Alternatively, the conductive pattern 64 for the storage capacitor may be omitted.

The ohmic contact patterns 55, 56 and 58 decrease a contact resistance between the semiconductor patterns 42 and 48 and the data wire 62, 64, 65, 66 and 68, and have a substantially same shape as the data wire 62, 64, 65, 66 and 68. That is, an ohmic contact pattern 55 for the data line member 62, 68 and 65 has a substantially same shape as the data line member 62, 68 and 65. In addition, an ohmic contact pattern 56 for the drain electrode 66 has a substantially same shape as the drain electrode 66. Furthermore, an ohmic contact pattern 58 for the storage capacitor is substantially with the conductive pattern 64 for the storage capacitor.

The semiconductor patterns 42 and 48 have a substantially same shape as the data wire 62, 64, 65, 66 and 68 and the ohmic contact patterns 55, 56 and 58 except a channel part C of the TFT. In particular, a semiconductor pattern 48 for the storage capacitor has a substantially same shape as the conductive pattern 64 for the storage capacitor and the ohmic contact pattern 58 for the storage capacitor. A semiconductor pattern 42 for the TFT may have a different shape as the data wire 62, 64, 65, 66 and 68 and the ohmic contact patterns 55 and 56 for the data line member 62, 68 and 65 and the drain electrode 66. That is, the source electrode 65 is spaced apart from the drain electrode 66 at the channel part C of the TFT, and the ohmic contact pattern 55 for the data line member is also spaced apart from the ohmic contact pattern 56 for the drain electrode 66. However, the semiconductor pattern 42 corresponding to the data line member is connected to the semiconductor pattern 42 corresponding to the drain electrode 66 to form the channel part C of the TFT between the source and drain electrodes 65 and 66. A protective layer 70 is on the data wire 62, 64, 65, 66 and 68.

Contact holes 76, 78 and 72 are on the protective layer 70 corresponding to the drain electrode 66, the data pad 68 and the conductive pattern 68 for the storage capacitor. The drain electrode 66, the data pad 64 and the conductive pattern 68 for the storage capacitor are exposed through the contact holes 76, 78 and 72. Another contact hole 74 through which the gate pad 24 is partially exposed is on the gate insulating layer 30 and the protective layer 70.

A pixel electrode 82 is on the protective layer 70. The pixel electrode 82 and the common electrode form an electric field in a liquid crystal layer based on the image signal through the TFT. The pixel electrode 82 includes a transparent conductive material. Examples of the transparent conductive material that can be used for the pixel electrode 82 include indium tin oxide (ITO), or indium zinc oxide (IZO). The pixel electrode 82 is electrically connected to the drain electrode 66 through the contact hole 76. The pixel electrode 82 is partially overlapped with a portion of the gate line 22 and a portion of the data line 62 to increase an opening rate of a pixel. Alternatively, the pixel electrode 82 may not be overlapped with the gate and data lines 22 and 62. The pixel electrode 82 may also be electrically connected to the conductive pattern 64 for the storage capacitor through the contact hole 72 to transmit the image signal to the conductive pattern 64 for the storage capacitor. An auxiliary gate pad 86 and an auxiliary data pad 88 are on the protective layer 70. The auxiliary gate pad 86 is electrically connected to the gate pad 24 through the contact hole 74. The auxiliary data pad 88 is electrically connected to the data pad 68 through the contact hole 78. The auxiliary gate pad 86 and the auxiliary data pad 88 protect the gate and data pads 24 and 68, respectively. Alternatively, the auxiliary gate pad 86 and the auxiliary data pad 88 may be omitted. The auxiliary gate pad 86 and the auxiliary data pad 88 may include the transparent conductive material.

Hereinafter, a method of manufacturing the TFT substrate for the LCD device using four masks is described. FIGS. 15A to 22B are cross-sectional views showing a method of manufacturing the TFT substrate for the LCD device shown in FIG. 12.

Referring to FIGS. 12 to 15B, the gate wire layer 221, 241 and 261 that includes aluminum, or aluminum/neodymium alloy is formed on the insulating substrate 10. The insulating substrate 10 having the gate wire layer 221, 241 and 261 is dipped in a chemical conversion coating solution to form the aluminum complex oxide layer 222, 242 and 262. The chemical conversion coating solution includes zirconium, tungsten, chromium, or molybdenum. Therefore, the gate wire having the gate line 22, the gate pad 24, the gate electrode 26 and the storage capacitor line 28 is formed on the insulating substrate 10.

Referring to FIGS. 12, 13, 14, 16A and 16B, the gate insulating layer 30 is formed on the insulating substrate 10 having the gate wire 22, 24, 26 and 28. A semiconductor layer 40 is formed on the gate insulating layer 30. An impurity implanted amorphous silicon layer 50 is formed on the semiconductor layer 40. Each of the gate insulating layer 30, the semiconductor layer 40 and the impurity implanted amorphous silicon layer 50 are formed through a chemical vapor deposition process. A thickness of the gate insulating layer 30 may be about 1,500 Å to about 5,000 Å. A thickness of the semiconductor layer 40 may be about 500 Å to about 2,000 Å. A thickness of the impurity implanted amorphous silicon layer 50 may be about 300 Å to about 600 Å. A conductive layer 60 including chromium is deposited on the impurity implanted amorphous silicon layer 50. A photoresist layer 110 is coated on the conductive layer 60. A thickness of the photoresist layer 110 may be about 1 μm to about 2 μm. Alternatively, the conductive layer 60 may include an aluminum or aluminum alloy layer, and an aluminum complex oxide layer may be formed on the aluminum layer.

Figure 17A:
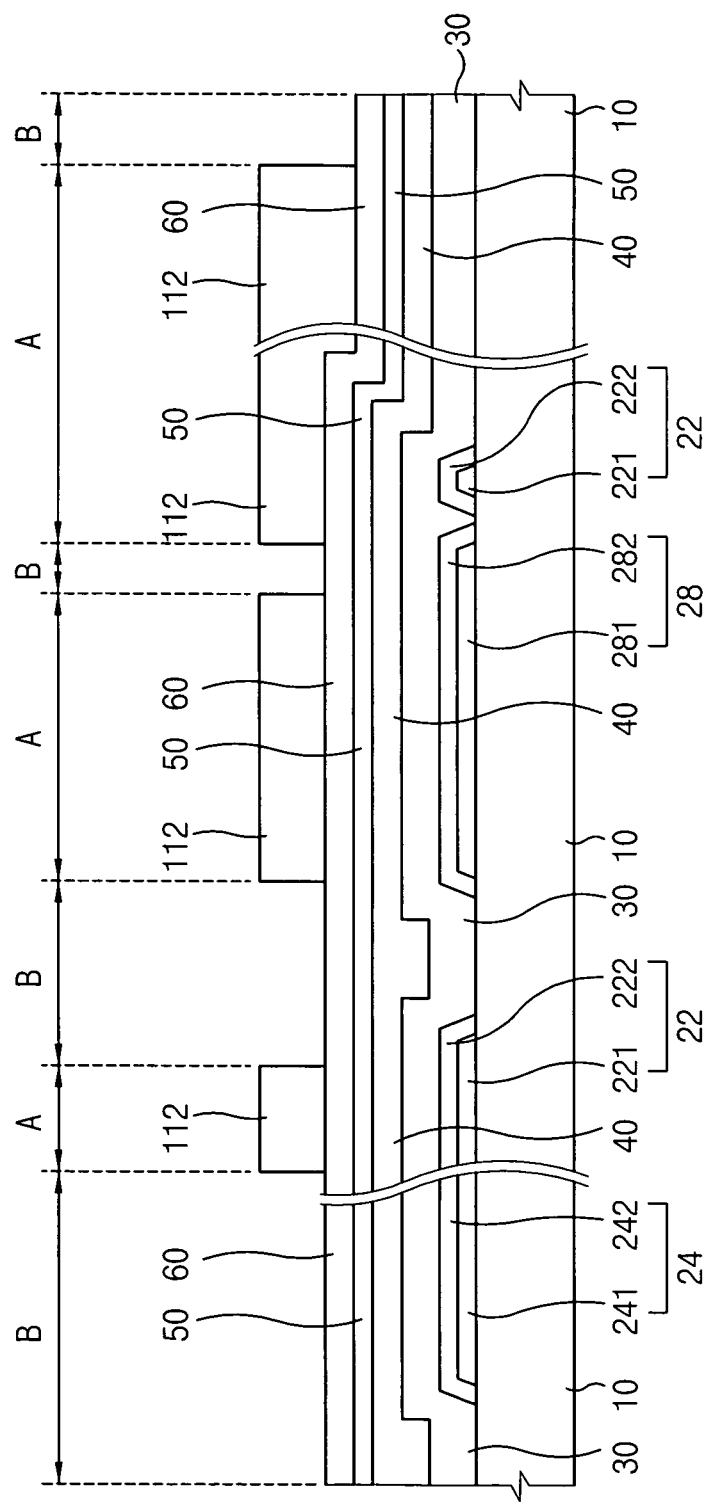
Figure 18A:
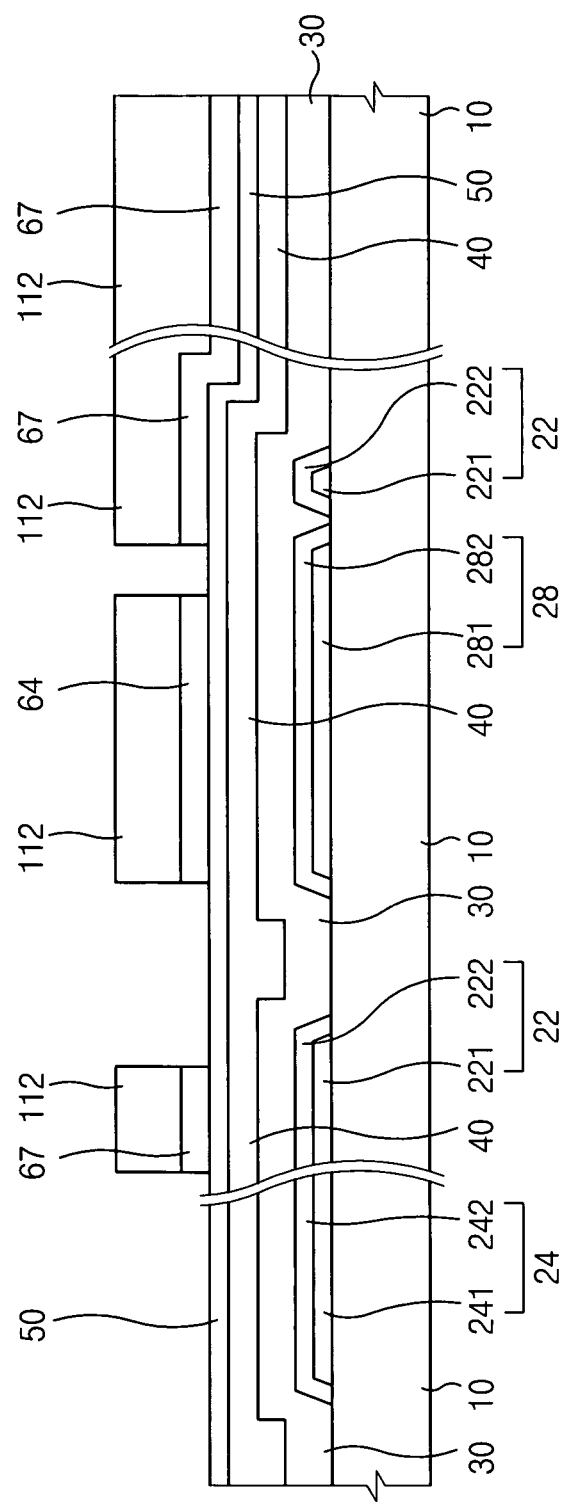
Figure 18B:
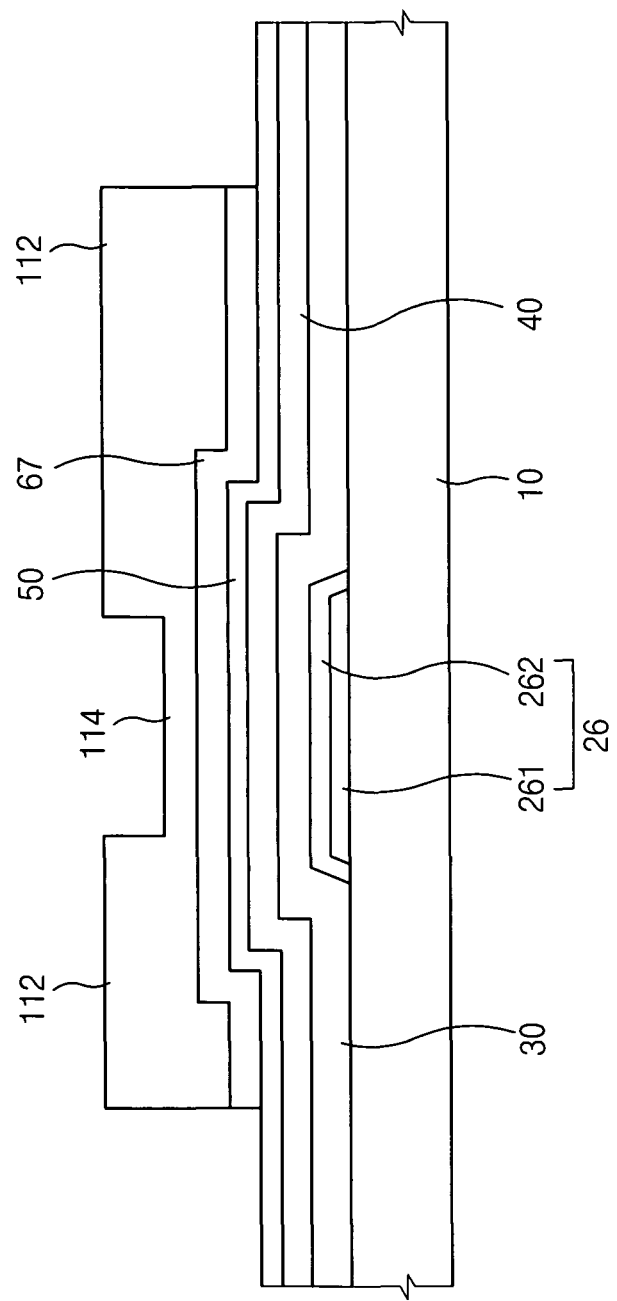

Referring to FIGS. 12, 13, 14, 17A and 17B, the photoresist layer 110 is exposed to a light through a mask. The exposed photoresist layer 110 is then developed to form first and second photoresist patterns 114 and 112. The first photoresist pattern 114 is in a channel region between the source and drain electrodes 65 and 66. The second photoresist pattern 112 is in a region A corresponding to the data line member. A remaining portion of the photoresist layer 110 in a region B is removed. The first photoresist pattern 114 has a smaller thickness than the second photoresist pattern 112. The thicknesses of the first and second photoresist patterns 114 and 112 may be changed. In FIGS. 17A and 17B, the thickness of the first photoresist pattern 114 is about a half of that of the second photoresist pattern 112. For example, the thickness of the first photoresist pattern 114 may be no more than about 4,000 Å.

The thicknesses of the first and second photoresist patterns 114 and 112 are controlled using various methods. For example, the mask may include slits, a mesh or a translucent pattern corresponding to the first photoresist pattern 114.

In FIGS. 17A and 17B, when the mask includes the slits, a distance between adjacent slits may be smaller than a resolution of an exposure. In addition, when the mask includes the translucent pattern, a light transmittance or a thickness of the mask corresponding to the first photoresist pattern 114 may be controlled.

After the exposure process, the exposed portion's crosslinks break down and become 'softened' due to the photochemical reaction called photosolubilization. The remaining portion of the photoresist layer 110 in the region B is fully exposed, and fully softened. The portion of the photoresist layer 110 in the channel region is partially exposed, and partially softened. The portion of the photoresist layer 110 in the region A is not exposed, and remains. After the development process, the fully exposed portion of the photoresist layer 110 is fully dissolved by a developing agent. In addition, the partially exposed portion of the photoresist layer 110 is partially dissolved by the developing agent. Furthermore, the un-exposed portion of the photoresist layer 110 is not dissolved. An exposure time of the exposure process controls the thicknesses of the first and second photoresist patterns 114 and 112.

Alternatively, the photoresist layer 110 may include a reflowable material so that the photoresist layer 110 may be exposed and developed using a mask having a transparent portion and an oblique portion, and then reflowed to form the first photoresist pattern 114 between two second photoresist patterns 112.

The conductive layer 60, the impurity implanted amorphous silicon layer 50 and the semiconductor layer 40 are partially etched through the first and second photoresist patterns 114 and 112. That is, the data wire and the semiconductor layer corresponding to the channel region remain, and a portion of the conductive layer 60, the impurity implanted amorphous silicon layer 50 and the semiconductor layer 40 in the region B is removed so that a portion of the gate insulating layer 30 corresponding to the region B is exposed.

In particular, referring to FIGS. 12, 13, 14, 18A and 18B, the conductive layer 60 in the region B is etched so that the impurity implanted amorphous silicon layer 50 in the region B is exposed. The conductive layer 60 in the region B may be etched through a dry etching process or a wet etching process. An etching agent may be adjusted so that the first and second photoresist patterns 114 and 112 may not be etched. Alternatively, the conductive layer 60 in the region B and a portion of the first and second photoresist patterns 114 and 112 may also be partially etched through the dry etching process. When the first and second photoresist patterns 114 and 112 are also partially etched, the thickness of the first photoresist pattern 114 is controlled so that the conductive layer 60 corresponding to the first photoresist pattern 114 may not be exposed.

The conductive layer 60 corresponding to the region B is removed so that the conductive layer 60 corresponding to the channel part C, the data wire, the conductive pattern 67 for source/drain electrodes and the conductive pattern 68 for the storage capacitor remain. The remaining conductive pattern 67 and 64 is substantially same as the data wire 62, 64, 66 and 68 except the channel part C. Alternatively, the first and second photoresist patterns 112 and 114 may be partially etched through the dry etching process.

Referring to FIGS. 12, 13, 14, 19A and 19B, the impurity implanted amorphous silicon layer 50 and the semiconductor layer 40 in the region B and the first photoresist pattern 114 are removed through a dry etching process. In particular, the first and second photoresist patterns 114 and 112 are substantially simultaneously etched with the impurity implanted amorphous silicon layer 50, and the gate insulating layer 30 may not be etched. The first and second photoresist patterns 114 and 112 may have a substantially same etching selectivity as the impurity implanted amorphous silicon layer 50. For example, the first and second photoresist patterns 114 and 112 and the impurity implanted amorphous silicon layer 50 are etched using an etching gas. Examples of the etching gas that can be used to etch the first and second photoresist patterns 114 and 112 and the impurity implanted amorphous silicon layer 50 include a mixture of sulfur hexafluoride $SF_6$ and hydrochloric HCl, a mixture of sulfur hexafluoride $SF_6$ and oxygen $O_2$. When the etching selectivity of the first and second photoresist patterns 114 and 112 is substantially same as the semiconductor layer 40, the thickness of the first photoresist pattern 114 is no more than a thickness of the semiconductor layer 40 and the impurity implanted amorphous silicon layer 50.

Therefore, the first photoresist pattern 114 in the channel part C is removed so that the conductive pattern 67 corresponding to the source/drain electrodes is exposed, and the impurity implanted amorphous silicon layer 50 and the semiconductor layer 40 corresponding to the region B are removed, thereby exposing the gate insulating layer 30 corresponding to the region B is exposed. In addition, the second photoresist pattern 112 is also partially etched so that the thickness of the second photoresist pattern 112 is decreased. Furthermore, the semiconductor patterns 42 and 48 are completed. Reference numerals 57 and 58 represent an impurity implanted amorphous silicon pattern 57 for the source/drain electrodes and an impurity implanted amorphous silicon pattern 58 for the conductive pattern 64 for the storage capacitor.

The remaining photoresist pattern is then removed from the conductive pattern 67 for the source/drain electrodes through an ashing process.

Figure 19A:
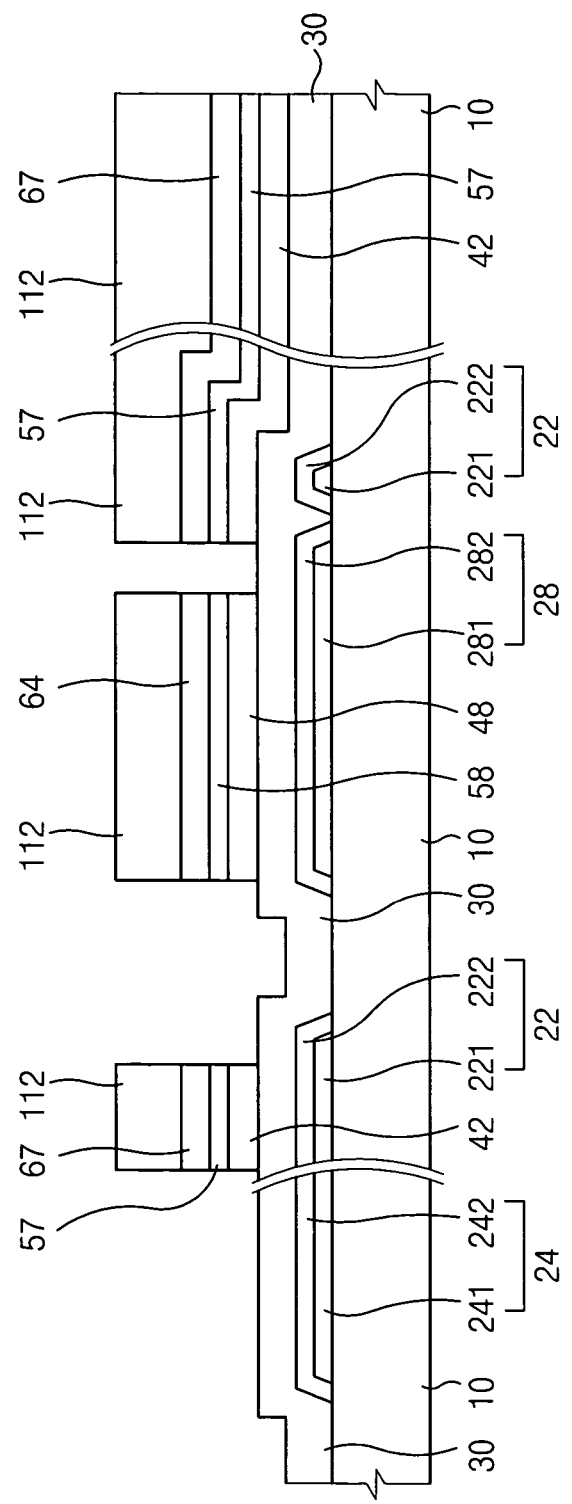
Figure 19B:
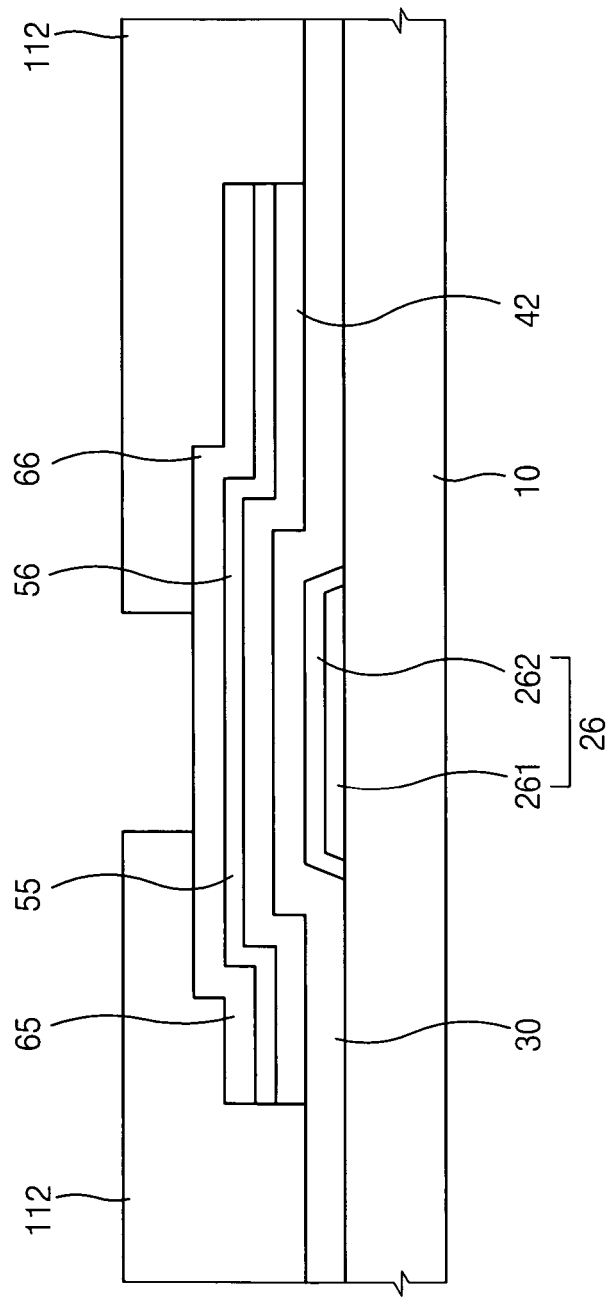
Figure 20A:
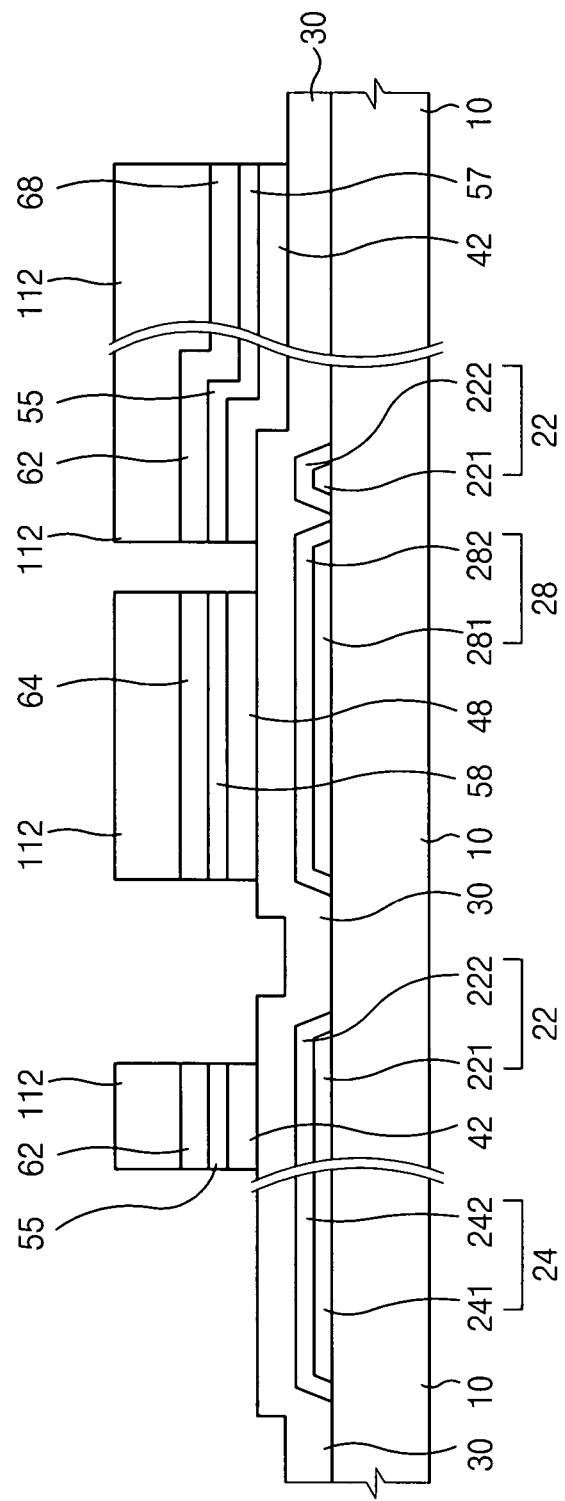
Figure 20B:
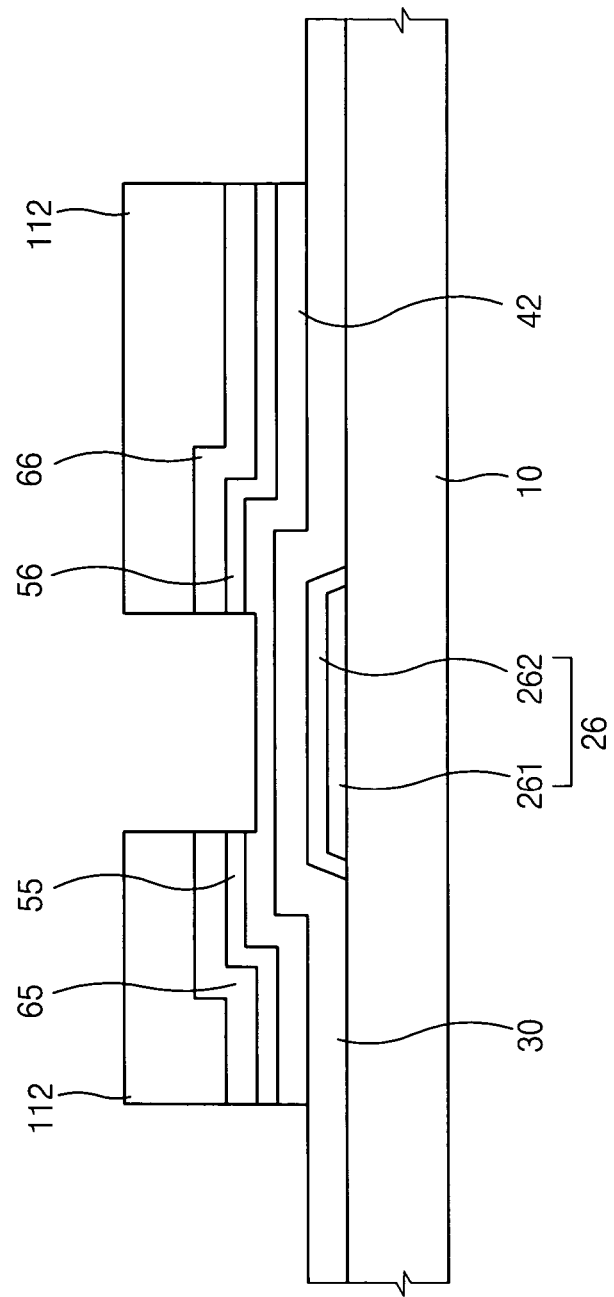

Referring to FIGS. 12, 13, 14, 20A and 20B, the conductive pattern 67 for the source/drain electrodes and the impurity implanted amorphous silicon pattern 57 for the source/drain electrodes are etched. For example, the conductive pattern 67 for the source/drain electrodes and the impurity implanted amorphous silicon pattern 57 for the source/drain electrodes may be etched through one dry etching process. Alternatively, the conductive pattern 67 for the source/drain electrodes and the impurity implanted amorphous silicon pattern 57 for the source/drain electrodes may be etched through a dry etching process and a wet etching process, respectively. When the conductive pattern 67 for the source/drain electrodes and the impurity implanted amorphous silicon pattern 57 for the source/drain electrodes are etched through the dry etching process, the conductive pattern 67 for the source/drain electrodes may have different etching selectivity from the impurity implanted amorphous silicon pattern 57 for the source/drain electrodes to easily control a thickness of the semiconductor pattern 42 corresponding to the channel part C. When the conductive pattern 67 for the source/drain electrodes and the impurity implanted amorphous silicon pattern 57 for the source/drain electrodes may be etched through a dry etching process and a wet etching process, respectively, a side of the conductive pattern 67 for the source/drain electrodes is more etched than a side of the impurity implanted amorphous silicon pattern 57 for the source/drain electrodes to form a stepped portion between the conductive pattern 67 for the source/drain electrodes and the impurity implanted amorphous silicon pattern 57 for the source/drain electrodes. For example, the impurity implanted amorphous silicon pattern 57 and the semiconductor pattern 42 may be etched using an etching gas. Examples of the etching gas that can be used to etch the impurity implanted amorphous silicon pattern 57 and the semiconductor pattern 42 include a mixture of carbon tetrafluoride $CF_4$ and hydrochloric acid HCl, a mixture of carbon tetrafluoride $CF_4$ and oxygen $O_2$. In FIG. 19B, the semiconductor pattern 42 may be partially removed so that a thickness of the semiconductor pattern 42 may be decreased. In addition, the thickness of the second photoresist pattern 112 may be decreased. The gate insulating layer 30 may not be etched through the etching process. The thickness of the second photoresist pattern 112 is controlled so that the data wire 62, 64, 65, 66 and 68 may not be exposed.

Therefore, the source electrode 65 is spaced apart from the drain electrode 66 so that the data wire 62, 64, 65, 66 and 68 and the ohmic contact patterns 55, 56 and 58 are completed.

The remaining second photoresist pattern 112 in the region A is removed from the data line member. Alternatively, the remaining second photoresist pattern 112 in the region A may be removed between removing the conductive pattern 67 for the source/drain electrodes and removing the impurity implanted amorphous silicon pattern 57.

Figure 21A:
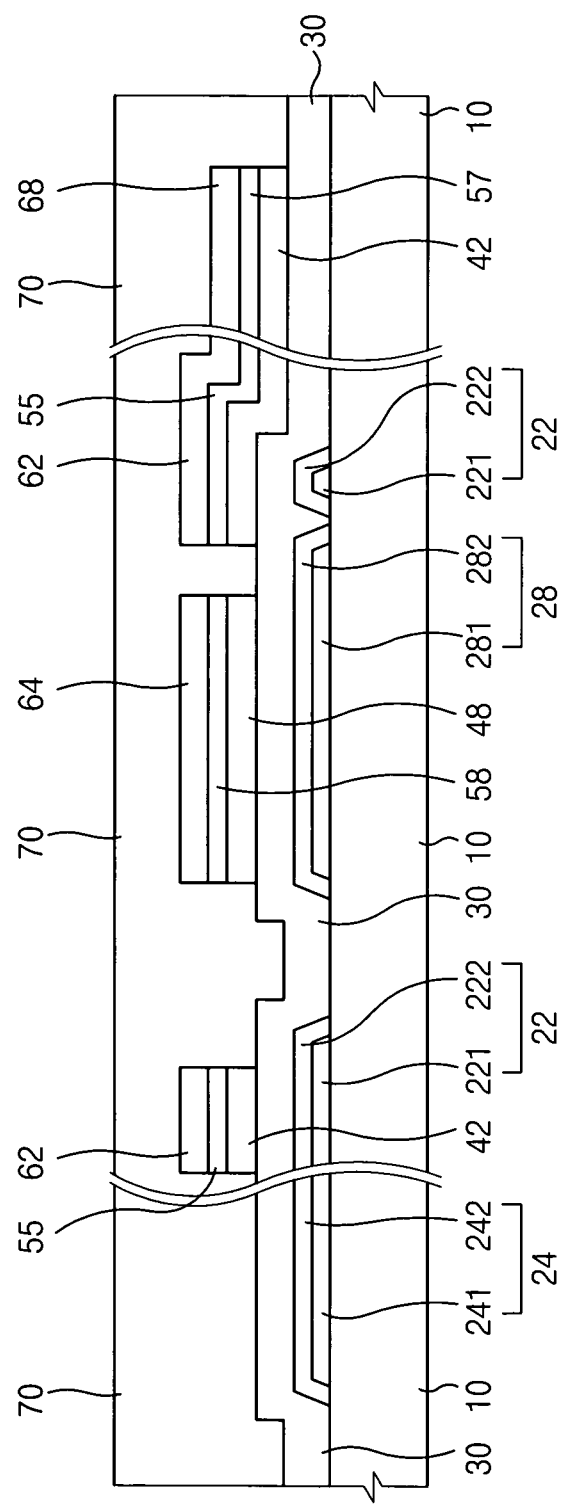
Figure 21B:
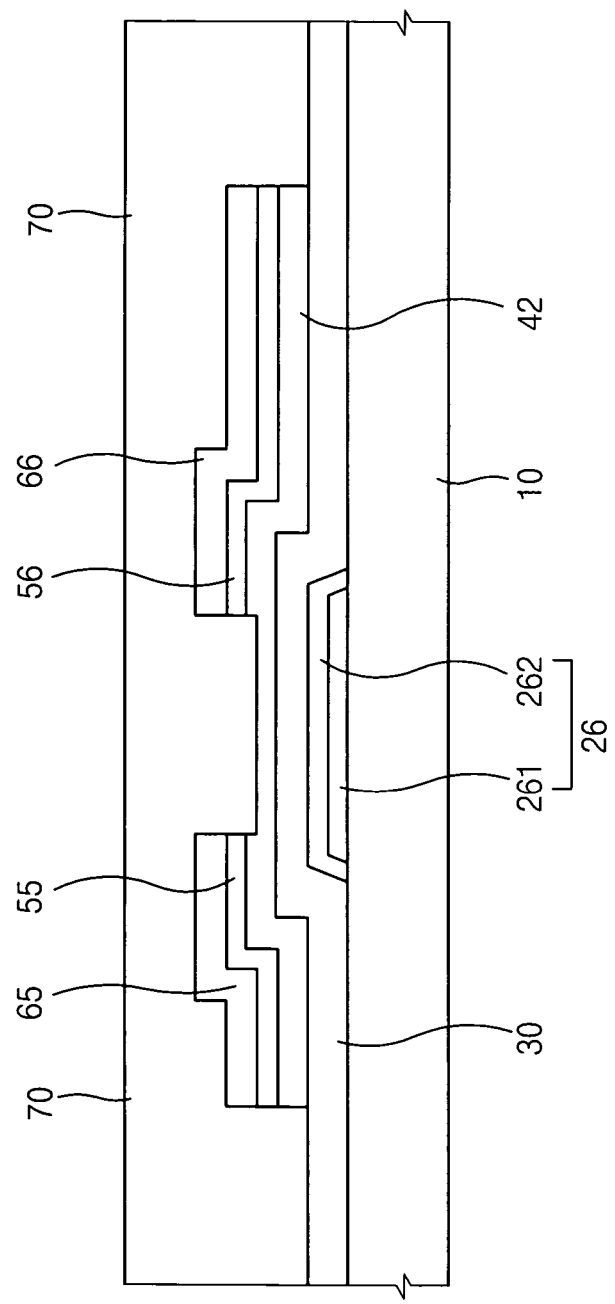
Figure 22A:
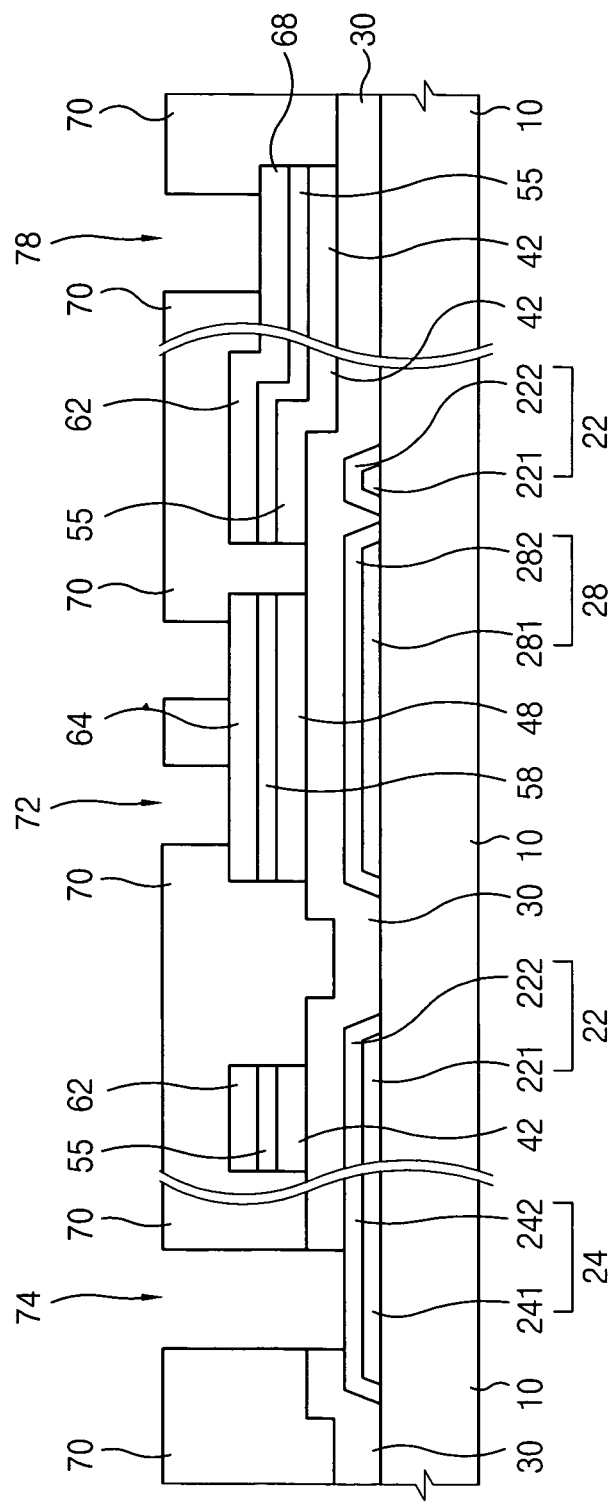
Figure 22B:
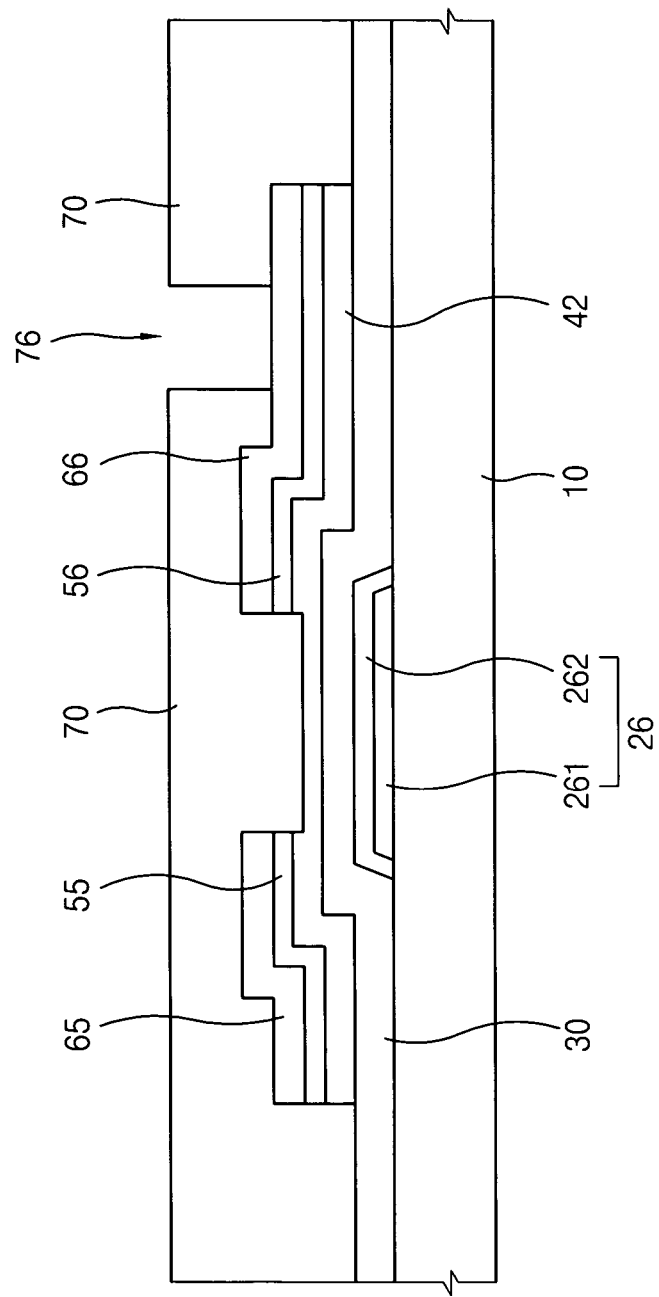

The impurity implanted amorphous silicon pattern 57 and the semiconductor pattern 42 may be etched using one dry etching process. Alternatively, the impurity implanted amorphous silicon pattern 57 and the semiconductor pattern 42 may be etched using a wet etching process and a dry etching process, respectively. When the impurity implanted amorphous silicon pattern 57 and the semiconductor pattern 42 is etched using the one dry etching process, a manufacturing process is simplified. However, the one dry etching process may be uncontrollable. When the impurity implanted amorphous silicon pattern 57 and the semiconductor pattern 42 are etched using a wet etching process and a dry etching process, respectively, the etching processes is easily controlled. However, the manufacturing process may be complicated. Referring to FIGS. 21A and 21B, the protective layer 70 is then formed on the insulating substrate 10.

Referring to FIGS. 12, 13, 14, 22A and 22B, the protective layer 70 and the gate insulating layer 30 are partially etched to form the contact holes 76, 74, 78 and 72 through which the drain electrode 66, the gate pad 24, the data pad 68 and the conductive pattern 64 for the storage capacitor are exposed, respectively. The contact holes 74 and 78 through which the gate pad 24 and the data pad 68 are partially exposed may have various shapes having an area of about 2 mm×60 μm to about 0.5 mm×15 μm. A portion of the aluminum complex oxide layer 242 that is exposed through the contact hole 74 may be removed using an etching agent including chromium oxide and phosphoric acid. Alternatively, the portion of the aluminum complex oxide layer 242 that is exposed through the contact hole 74 may not be removed.

A transparent conductive layer including the indium tin oxide (ITO) or the indium zinc oxide (IZO) is deposited on the insulating substrate 10 at a thickness of about 400 Å to about 500 Å. The transparent conductive layer is partially etched to form the pixel electrode 82 electrically connected to the drain electrode 66 and the conductive pattern 64 for the storage capacitor, the auxiliary gate pad 86 electrically connected to the gate pad 24 and the auxiliary data pad 88 electrically connected to the data pad 68.

Before forming the transparent conductive layer, the substrate 10 having the protective layer 70 may be pre-heated using a nitrogen gas to prevent an oxidation of the gate pad 24, the conductive pattern 64 for the storage capacitor, the drain electrode 66 and the data pad 68 that are exposed through the contact holes 72, 76, 74 and 78, respectively.

In FIGS. 12 to 22B, the data wire 62, 64, 65, 66 and 68, the ohmic contact patterns 55, 56 and 58 and the semiconductor patterns 42 and 48 are formed, and the source electrode 65 is spaced apart from the drain electrode 66 using one mask, thereby simplifying the manufacturing process.

Alternatively, the TFT substrate may further include a color filter. That is, the TFT substrate may have an array on color filter (AOC) structure.

Figure 23:
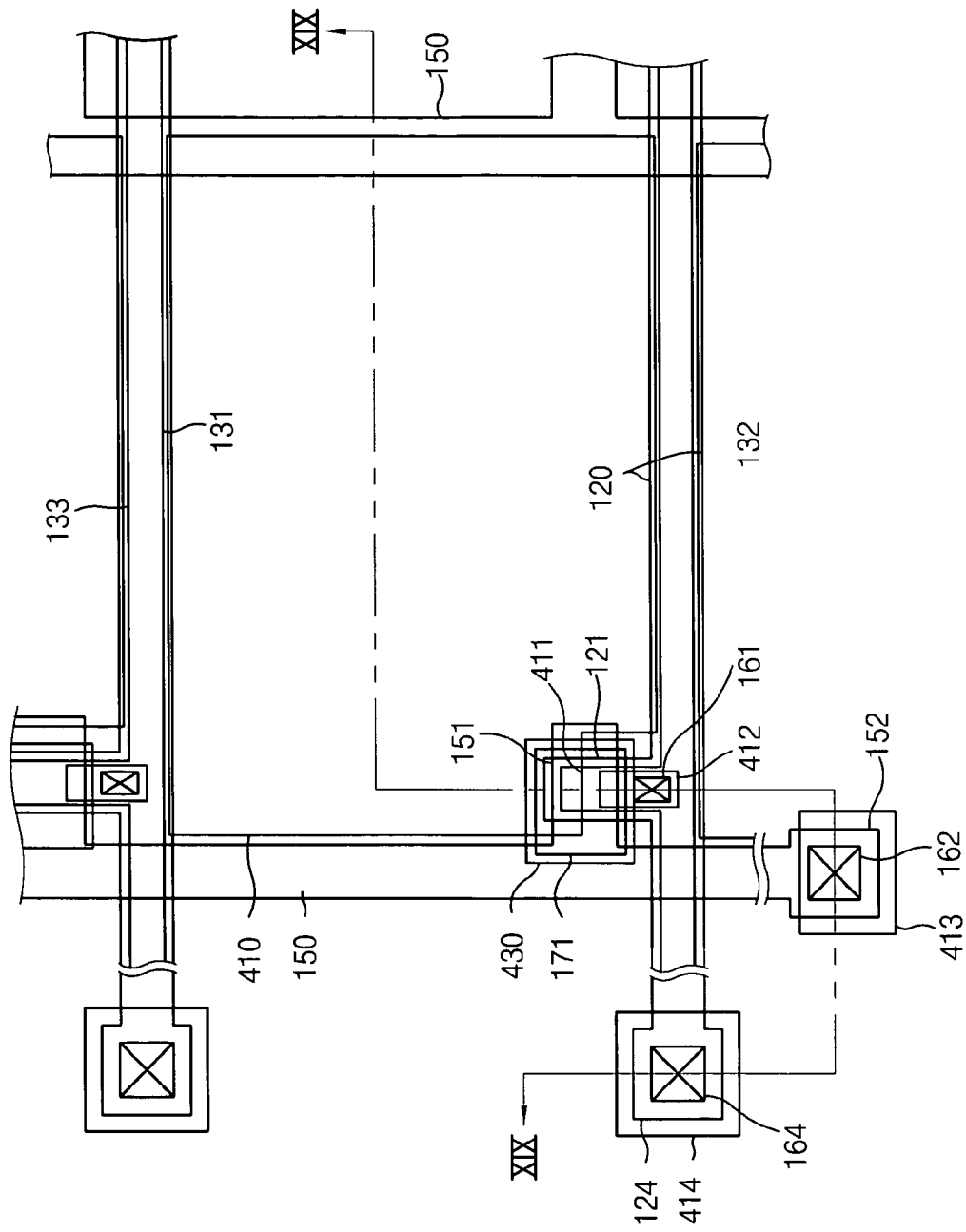
FIG. 23 is a plan view showing an LCD device in accordance with another embodiment of the present invention.
Figure 24:
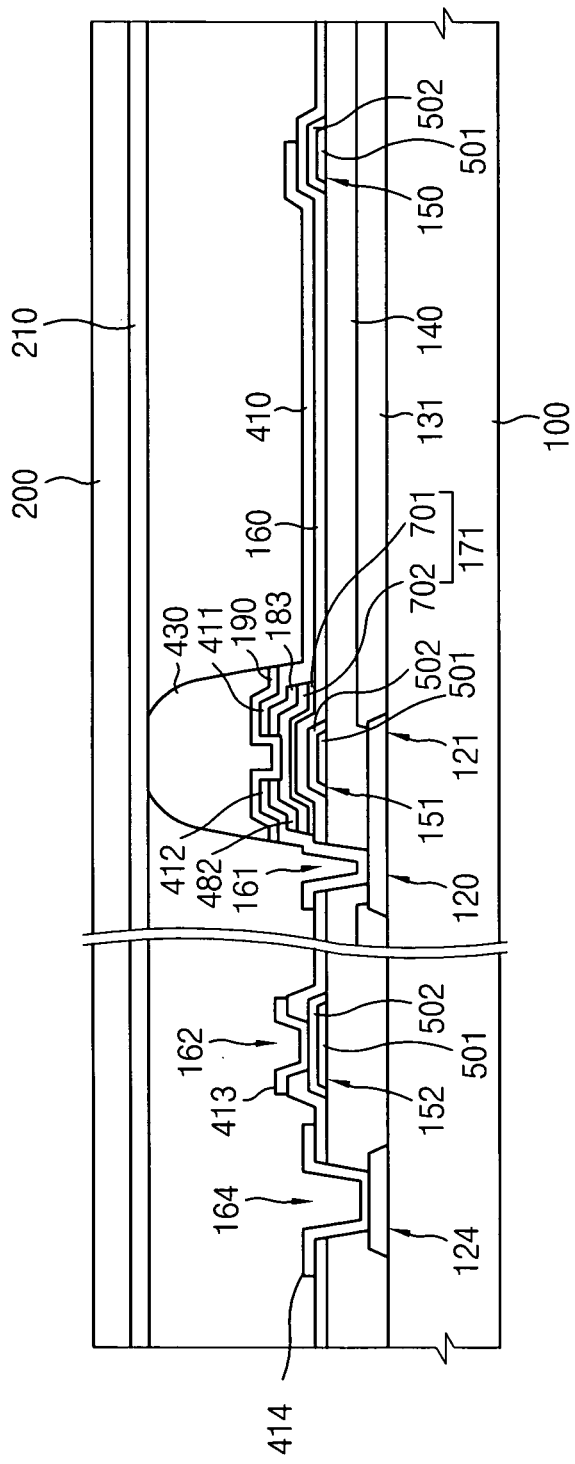
FIG. 24 is a cross-sectional view taken along a line XIX-XIX' shown in FIG. 23.

FIG. 23 is a plan view showing an LCD device in accordance with another embodiment of the present invention. FIG. 24 is a cross-sectional view taken along a line XIX-XIX' shown in FIG. 23.

Referring to FIGS. 23 and 24, a data wire 120, 121 and 124 is on a lower insulating substrate 100. The data wire 120, 121 and 124 includes a data line 120, a data pad 124 and a light blocking part 121. The data line 120 extends in a horizontal direction of the lower insulating substrate 100. The data pad 124 is electrically connected to the data line 120 to transmit an externally provided image signal. The light blocking part 121 is connected to the data line 120 to block a light that is incident into a semiconductor layer 170 of a thin film transistor (TFT) from a lower side of the lower insulating substrate 100. The light blocking part 121 functions as a black matrix and a repair pattern for the data line 120.

A red color filter 131, a green color filter 132 and a blue color filter 133 are on the lower insulating substrate 100 having the data wire 120, 121 and 124. End portions of the red, green and blue color filters 131, 132 and 133 are partially overlapped with the data line 120 and the light blocking part 121. Alternatively, the red, green and blue color filters 131, 132 and 133 may cover the data line 120.

A buffer layer 140 is on the data wire 120, 121 and 124 and the red, green and blue color filters 131, 132 and 133. The buffer layer 140 prevents an outgassing of the red, green and blue color filters 131, 132 and 133, and protects the red, green and blue color filters 131, 132 and 133 from a heat or a plasma of subsequent processes. The data wire 120, 121 and 124 is spaced apart from the TFT by the buffer layer 140 to decrease a parasitic capacitance between the data wire 120, 121 and 124 and the TFT. For example, the buffer layer 140 has a low dielectric constant and a thick thickness.

A gate wire is on the buffer layer 140. The gate wire includes a gate wire layer 501 and an upper layer 502. Examples of a material that can be used for the gate wire layer 501 include aluminum, or aluminum/neodymium alloy. For example, the upper layer 502 may be an aluminum alloy oxide layer.

The gate wire includes a gate line 150, a gate pad 152 and a gate electrode 151 of the TFT. The gate line 150 is extended in a longitudinal direction of the lower insulating substrate 100 to cross the data line 120. The gate pad 152 is electrically connected to the gate line 150 to transmit an externally provided scan signals. The gate electrode 151 is electrically connected to the gate line 150.

The gate line 150 is partially overlapped with a pixel electrode 410 to form a storage capacitor that maintains a voltage difference between the pixel electrode 410 and a common electrode. Alternatively, the TFT substrate of the LCD device may further include a storage capacitor line.

A gate insulating layer 160 is on the gate wire 150, 151 and 152 and the buffer layer 140. The gate insulating layer 160 may be formed at a low temperature. Examples of an insulating material that can be used for the gate insulating layer 160 include an organic insulating layer, a low temperature amorphous silicon oxide layer, or a low temperature amorphous silicon nitride layer. In FIGS. 23 and 24, the red, green and blue color filters 131, 132 and 133 are on the lower insulating substrate 100 so that the gate insulating layer 160 is formed at the low temperature to protect the red, green and blue color filters 131, 132 and 133.

A semiconductor layer 171 is on the gate insulating layer 160 corresponding to the gate electrode 151. The semiconductor layer 171 has an island shape. The semiconductor layer 171 includes a lower semiconductor layer portion 701 and an upper semiconductor layer portion 702. The lower semiconductor layer portion 701 includes amorphous silicon having high band gap. The upper semiconductor layer portion 702 includes amorphous silicon having low band gap. For example, the band gap of the lower semiconductor layer portion 701 is about 1.9 eV to about 2.1 eV, and the band gap of the upper semiconductor layer portion 702 is about 1.7 eV to about 1.8 eV. A thickness of the lower semiconductor layer portion 701 may be about 50 Å to about 200 Å, and a thickness of the upper semiconductor layer portion 702 may be about 1,000 Å to about 2,000 Å.

A band offset is formed between the upper semiconductor layer portion 702 and the lower semiconductor layer portion 701 that has different band gap from the upper semiconductor layer portion 702. The band offset corresponds to a difference between the band gaps of the upper and lower semiconductor layer portions 702 and 701. When the TFT is turned on, a channel is formed in a band offset region that is between the upper and lower semiconductor layer portions 702 and 701. Molecules in the band offset region have a substantially same atomic structure each other to improve electric characteristics of the TFT. Alternatively, the semiconductor layer 171 may have a mono layer structure.

Ohmic contact patterns 182 and 183 are on the semiconductor layer 171. Examples of a material that can be used for the ohmic contact patterns 182 and 183 include amorphous silicon, polysilicon, metal silicide. The ohmic contact patterns 182 and 183 are spaced apart from each other.

A pixel wire 410, 411 and 412 is on the ohmic contact patterns 182 and 183. The pixel wire 410, 411 and 412 includes a source electrode 412, a drain electrode 411 and a pixel electrode 410. The source electrode 412 is electrically connected to a data line 120 through a contact hole 161 that is formed on the gate insulating layer 160 and the buffer layer 140. The drain electrode 411 is electrically connected to the pixel electrode 410. The drain electrode 411 transmits an image signal from the TFT to the pixel electrode 410. The pixel wire 410, 411 and 412 includes a transparent conductive material. Examples of the transparent conductive material that can be used for the pixel wire 410, 411 and 412 include indium tin oxide (ITO), or indium zinc oxide (IZO).

An auxiliary gate pad 413 and an auxiliary data pad 414 are on a substantially same layer as the pixel wire 410, 411 and 412. The auxiliary gate pad 413 and the auxiliary data pad 414 are electrically connected to the gate pad 152 and the data pad 124 through contact holes 162 and 164, respectively. The auxiliary gate pad 413 makes contact with an upper portion 502 of the gate pad 152. The upper portion 502 of the gate pad 152 includes an aluminum complex oxide layer. The auxiliary data pad 414 makes contact with an upper portion of the data pad 124. In FIGS. 23 and 24, the pixel electrode 410 is overlapped with the gate line 150 and the data line 120 to increase an opening rate of a pixel. Alternatively, the pixel electrode 410 may be spaced apart from the gate and data lines 150 and 120.

A protective layer 190 is on the source electrode 412 and the drain electrode 411 to protect the TFT. A photoresist colored organic layer 430 is on the protective layer 190. The photoresist colored organic layer 430 absorbs a light that is incident into the semiconductor layer 171 of the TFT. A thickness of the photoresist colored organic layer 430 is adjusted to control a distance between the lower insulating 10 substrate 100 and an upper insulating substrate 200 that corresponds to the lower insulating substrate 100. That is, the photoresist colored organic layer 430 may function as a spacer. The protective layer 190 and the photoresist colored organic layer 430 may be along the gate line 150 and the data line 120 to block a light leaked from the gate line 150 and the data line 120.

The common electrode 210 is on an entire surface of the upper insulating substrate 200. The common electrode 210 includes a transparent conductive material. Examples of the transparent conductive material that can be used for the common electrode 210 include indium tin oxide (ITO), or indium zinc oxide (IZO). The common electrode 210 and the pixel electrode 410 form an electric field to change an arrangement of liquid crystals.

FIGS. 25 to 32 are cross-sectional views showing a method of manufacturing the TFT substrate for the LCD device shown in FIG. 24.

Figure 25:
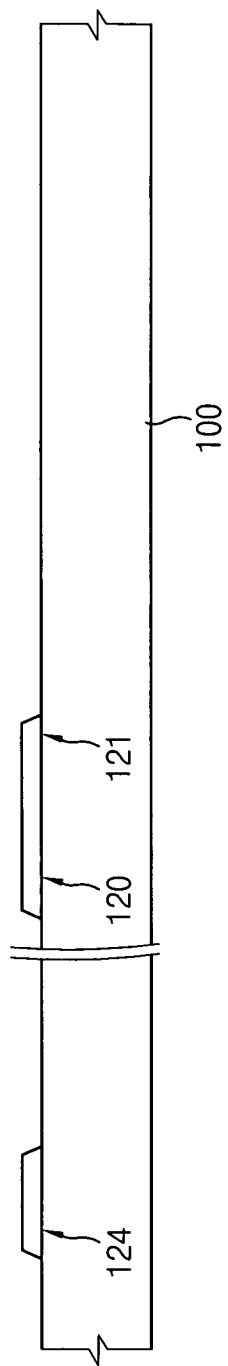

Referring to FIGS. 23 to 25, a chromium layer is deposited on the upper insulating substrate 100 at a thickness of about 4,000 Å. The chromium layer is partially etched through a dry etching process or a wet etching process to form the data wire 120, 121 and 124 that includes the data line 120, the data pad 124 and the light blocking part 121.

Figure 26:
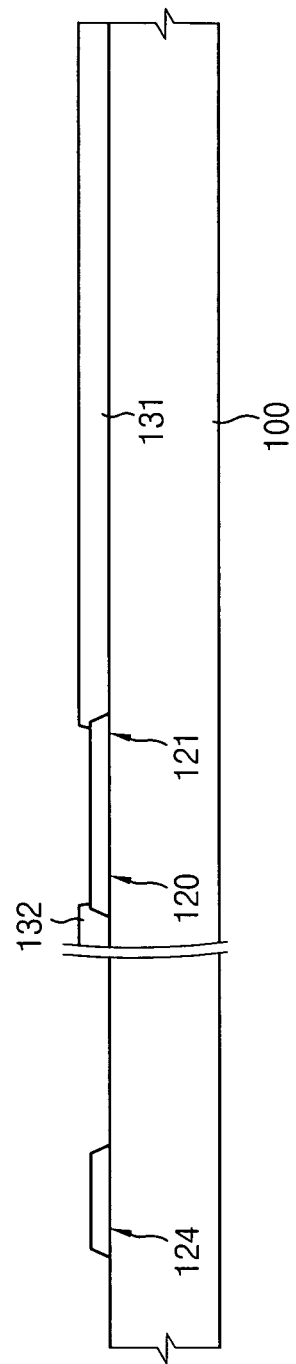
Figure 27:
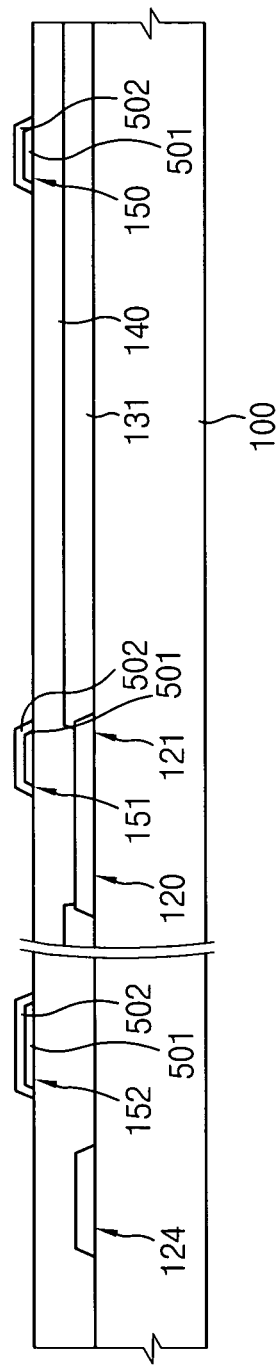

Referring to FIGS. 23, 24 and 26, a photoresist material including a red colorant, a photoresist material including a green colorant and a photoresist material including a blue colorant are coated on the upper insulating substrate 100 having the data wire 120, 121 and 124 and patterned to form a red color filter 131, a green color filter 132 and a blue color filter 133. The red, green and blue color filters 131, 132 and 133 may be formed through three exposure and development processes. In FIGS. 23, 24 and 26, one mask is used for the three exposure processes. Alternatively, three masks corresponding to the red, green and blue color filters 131, 132 and 133 may be used to form the three exposure processes, respectively. The red, green and blue color filters 131, 132 and 133 may be formed through a laser printing method without a mask, thereby decreasing a manufacturing cost. Sides of the red, green and blue color filters 131, 132 and 133 may be overlapped with the data line 120. Referring to FIGS. 23, 24 and 27, the buffer layer 140 is formed on the upper insulating substrate 100 having the red, green and blue color filters 131, 132 and 133.

An aluminum layer is deposited on the buffer layer 140 through a sputtering method. Alternatively, an aluminum alloy layer may be deposited on the buffer layer 140 using other well known processes. The aluminum layer is patterned to form the gate wire layer 501. The upper substrate 100 having the gate wire 501 is dipped in a chemical conversion coating solution to form the upper portion 502 on the gate wire layer 501, thereby forming the gate wire 150, 151 and 152. The chemical conversion coating solution includes metal ions. Examples of the metal ions that can be used for the chemical conversion coating solution include zirconium, tungsten, chromium, and molybdenum. These can be used alone or in a combination thereof. The gate wire 150, 151 and 152 includes the gate line 150, the gate electrode 151 and the gate pad 152.

Figure 28:
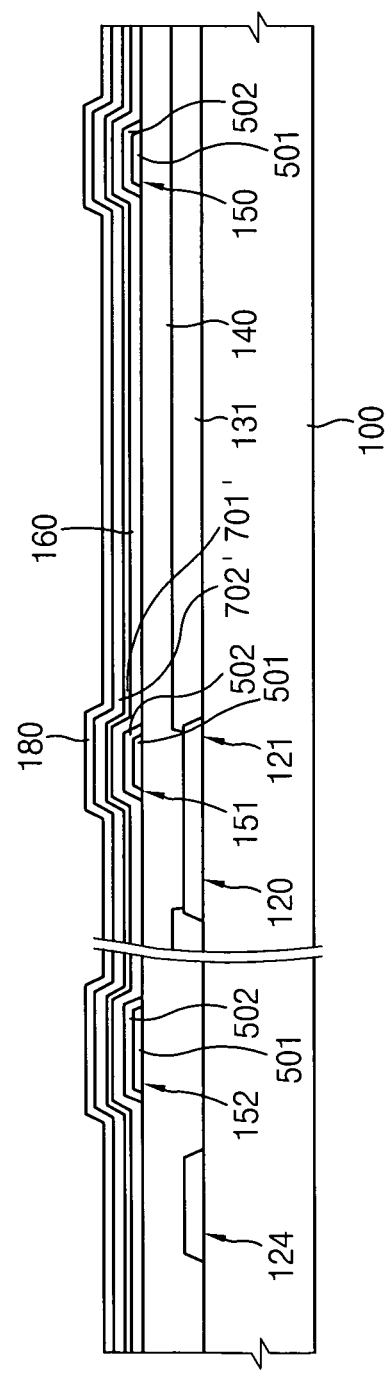

Referring to FIGS. 23, 24 and 28, the gate insulating layer 160 is formed on the upper insulating substrate 100 having the gate wire 151, 152 and 152 and the buffer layer 140. A lower semiconductor layer 701' is formed on the gate insulating layer 160. An upper semiconductor layer 702' is formed on the lower semiconductor layer 701'. An impurity implanted amorphous silicon layer 180 is formed on the upper semiconductor layer 702'.

The gate insulating layer 160 is deposited at a low temperature that is no more than about 250° C. The insulating material that can be used for the gate insulating layer 160 include an organic insulating layer, an amorphous silicon oxide layer, an amorphous silicon nitride layer.

For example, the lower semiconductor layer 701' includes an amorphous silicon having a band gap of about 1.9 eV to about 2.1 eV. The upper semiconductor layer 702' includes an amorphous silicon having a band gap of about 1.7 eV to about 1.8 eV. The lower semiconductor layer 701' may be deposited through a chemical vapor deposition process using a mixture gas of $SiH_4$, $CH_4$, $C_2H_2$, and $C_2H_6$. For example, when $SiH_4$ and $CH_4$ are mixed in a ratio of about 1:9, the lower semiconductor layer 701' includes the band gap of about 2.0 eV to about 2.3 eV and carbon of about 50 wt %. In the chemical vapor deposition process, a composition of the mixture gas is adjusted to control the band gap of the lower semiconductor layer 701' and the upper semiconductor layer 702'.

The gate insulating layer 160, the lower semiconductor layer 701', the upper semiconductor layer 702' and the impurity implanted amorphous silicon layer 180 may be deposited in situ in a substantially same chamber.

Figure 29:
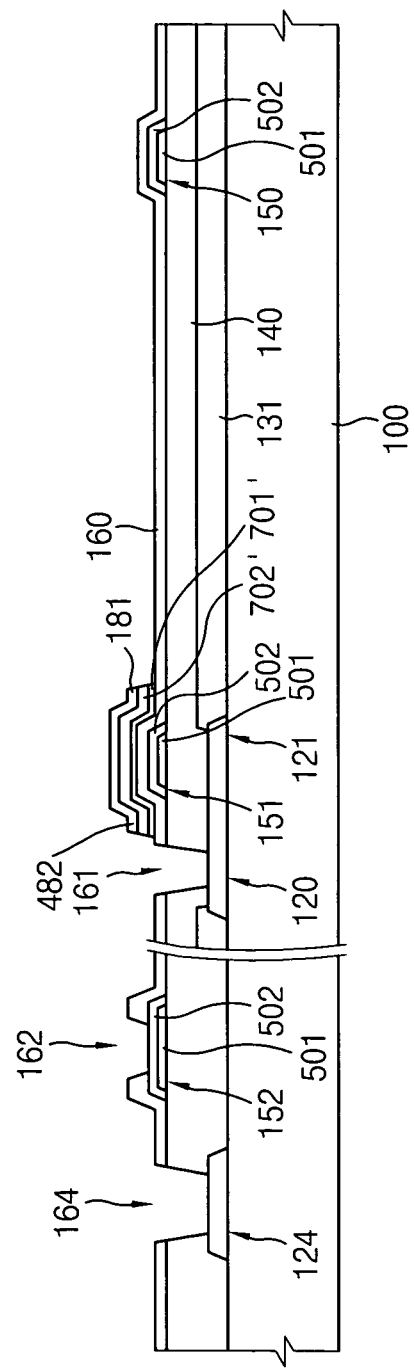

Referring to FIGS. 23, 24 and 29, the lower semiconductor layer 701', the upper semiconductor layer 702' and the impurity implanted amorphous silicon layer 180 are patterned using a mask to form the semiconductor layer 171 and an ohmic contact layer 181. The semiconductor layer 171 and the ohmic contact layer 181 may have an island shape. In addition, the contact holes 161, 162 and 164 through which the data line 120, the gate pad 152 and the data pad 124 are partially exposed, respectively, are formed on the gate insulating layer 160 and the buffer layer 140. The contact holes 161, 162 and 164 may be formed through a substantially same process as the patterning the lower semiconductor layer 701', the upper semiconductor layer 702' and the impurity implanted amorphous silicon layer 180.

In particular, a portion of the lower semiconductor layer 701', the upper semiconductor layer 702' and the impurity implanted amorphous silicon layer 180 corresponding to the gate electrode 151 remains, and a remaining portion of the lower semiconductor layer 701', the upper semiconductor layer 702' and the impurity implanted amorphous silicon layer 180 that does not correspond to the gate electrode 151 is removed. A portion of the gate insulating layer 160 corresponding to the gate pad 152 is removed with the lower semiconductor layer 701', the upper semiconductor layer 702' and the impurity implanted amorphous silicon layer 180. A portion of the gate insulating layer 160 and the buffer layer 140 corresponding to the data line 120 and the data pad 124 is removed with the lower semiconductor layer 701', the upper semiconductor layer 702' and the impurity implanted amorphous silicon layer 180.

One mask may be used for patterning the lower semiconductor layer 701', the upper semiconductor layer 702' and the impurity implanted amorphous silicon layer 180 and forming the contact holes 161, 162 and 164. Photoresist patterns for patterning the lower semiconductor layer 701', the upper semiconductor layer 702' and the impurity implanted amorphous silicon layer 180 and forming the contact holes 161, 162 and 164 may have various thicknesses.

Figure 30:
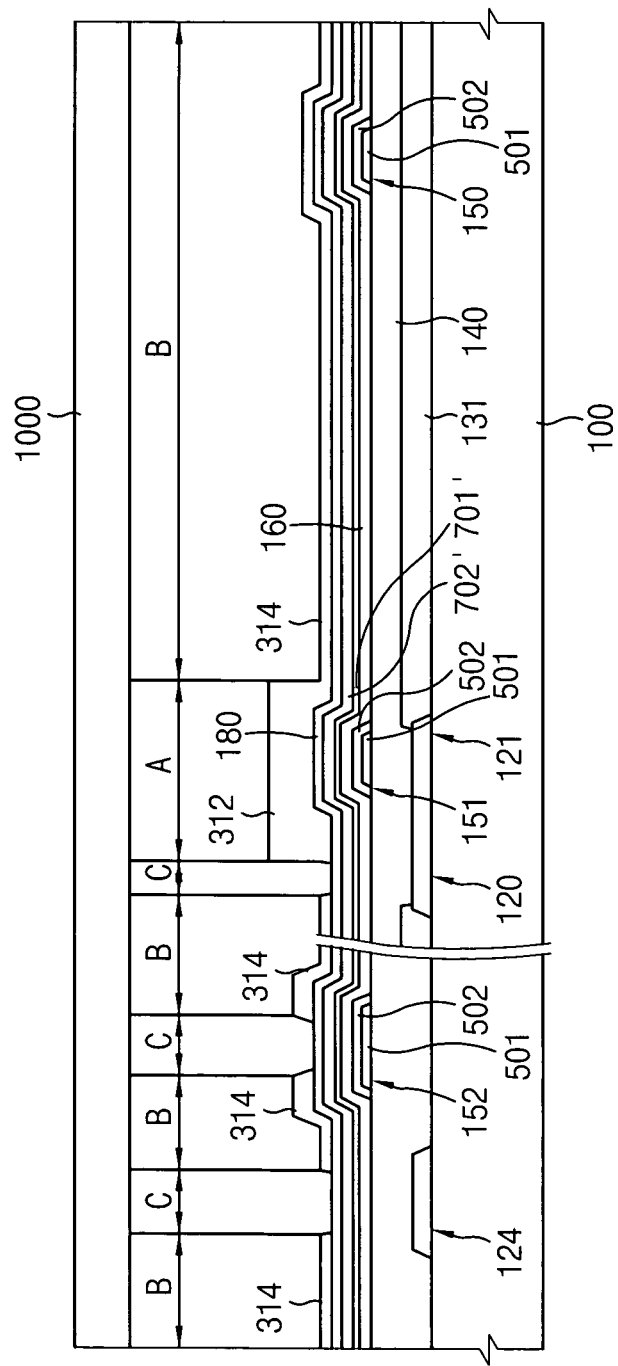

Referring to FIGS. 23, 24 and 30, a photoresist layer is coated on the impurity implanted amorphous silicon layer 180 at a thickness of about 1 μm to about 2 μm. The photoresist layer is exposed using a mask, and the exposed photoresist layer is developed to form photoresist patterns 312 and 314.

The photoresist patterns 312 and 314 include a first photoresist pattern 312 and a second photoresist pattern 314. The first photoresist pattern 312 that is in a region A corresponding to the gate electrode 141 has greater thickness than the second photoresist pattern 314. The photoresist patterns 312 and 314 are not in a region C corresponding to the data line 120, the data pad 124 and the gate pad 152. For example, the thickness of the second photoresist pattern 314 is about a half of that of the first photoresist pattern 312. For example, the thickness of the second photoresist pattern 314 may be no more than about 4,000 Å.

The thicknesses of the first and second photoresist patterns 312 and 314 are controlled using various methods. In FIG. 30, the first and second photoresist patterns 312 and 314 include a positive photoresist material.

A mask 1000 for forming the first and second photoresist patterns 312 and 314 may include slits, a mesh, or a translucent pattern, to control an amount of a light that is irradiated onto the photoresist layer. When the mask includes the slits, a distance between adjacent slits may be smaller than a resolution of an exposure. After the exposure process, the exposed portion's cross-links break down and become 'softened' due to the photochemical reaction called photosolubilization. The remaining portion of the photoresist layer in the region C is fully exposed, and fully softened. The portion of the photoresist layer in the region B is partially exposed, and partially softened. The portion of the photoresist layer in the region A is not exposed, and remains.

After the development process, the fully exposed portion of the photoresist layer is fully dissolved by a developing agent. In addition, the partially exposed portion of the photoresist layer is partially dissolved by the developing agent. Furthermore, the un-exposed portion of the photoresist layer is not dissolved. An exposure time of the exposure process controls the thicknesses of the first and second photoresist patterns 312 and 314. Therefore, the first photoresist pattern 312 has a different thickness from the second photoresist pattern 314.

Figure 31:
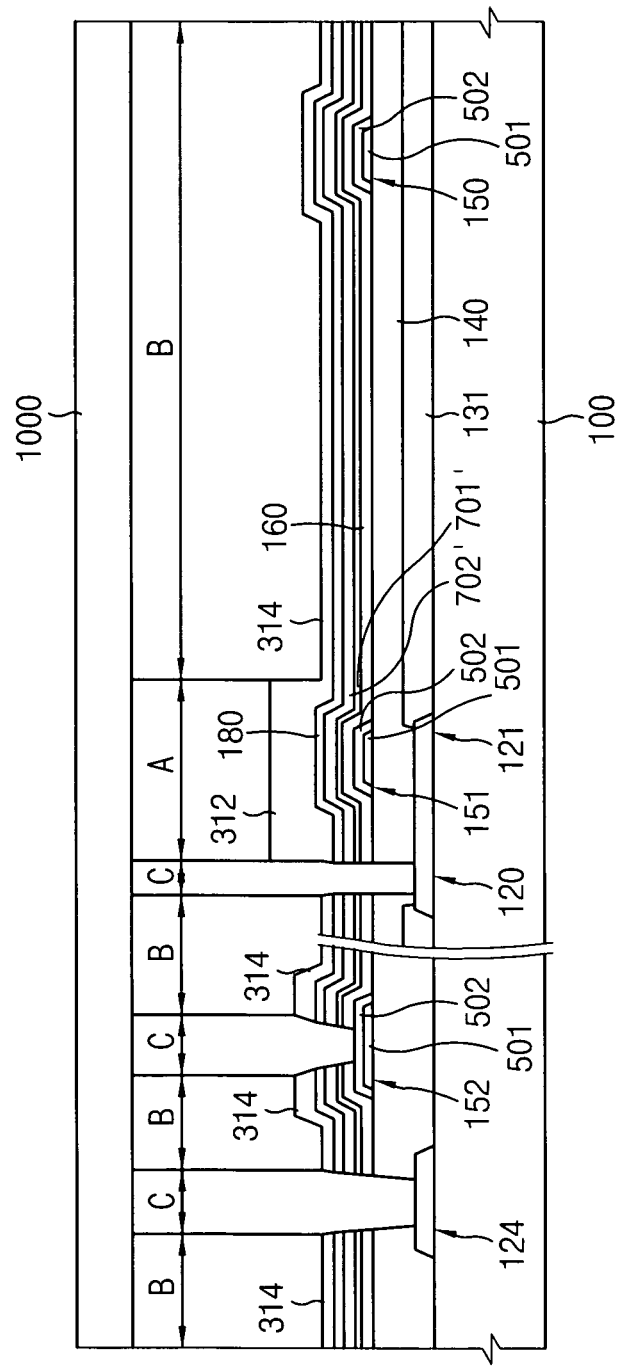

Then, as shown in FIG. 31, the impurity implanted amorphous silicon layer 180, the upper amorphous silicon layer 702', the lower amorphous silicon layer 701' and the gate insulating layer 160 are partially etched through the first and second photoresist patterns 312 and 314 through a dry etching process so that the gate pad 152 is exposed through the contact hole 162, and the buffer layer 140 in the region C is exposed. A portion of the buffer layer 140 in the region C is then etched to form the contact holes 161 and 164 through the data line 120 and the data pad 124 are partially exposed, respectively.

The second photoresist pattern 314 is removed. The second photoresist pattern 314 may be removed through an ashing process using an oxygen gas.

When the second photoresist pattern 314 is removed, the impurity implanted amorphous silicon layer 180 is exposed, and the thickness of the first photoresist pattern 312 is decreased.

The impurity implanted amorphous silicon layer 180, the upper amorphous silicon layer 701' and the lower amorphous silicon layer 702' are partially etched through the remaining first photoresist pattern 312 as an etching mask to form the semiconductor layer 171 and the ohmic contact layer 181 one the gate insulating layer 160 corresponding to the gate electrode 151. The semiconductor layer 171 and the ohmic contact layer 181 have the island shape.

The first photoresist pattern 312 is then removed. The first photoresist pattern 312 may be removed through an ashing process using an oxygen gas.

Referring to FIGS. 23, 24 and 32, a transparent conductive layer is then deposited on the lower insulating substrate 100. The transparent conductive layer is patterned to form the pixel electrode 410, the source electrode 412, the drain electrode 411, the auxiliary gate pad 413 and the auxiliary data pad 414.

A portion of the ohmic contact layer 181 between the source and drain electrodes 412 and 411 is etched to form the ohmic contact patterns 182 and 183 so that the semiconductor layer 171 is partially exposed between the source and drain electrodes 412 and 411.

Referring again to FIGS. 23 and 24, an insulating layer is then deposited on the lower insulating substrate 100. A colored photoresist organic layer including a black colorant is coated on the insulating layer. The colored photoresist organic layer is patterned to form the colored organic layer 430. The insulating layer is partially etched using the colored organic layer 430 as an etching mask. The photoresist colored organic layer 430 absorbs the light that is incident into the semiconductor layer 171 of the TFT. A thickness of the photoresist colored organic layer 430 is adjusted to control the distance between the lower insulating substrate 100 and the upper insulating substrate 200 that corresponds to the lower insulating substrate 100. That is, the photoresist colored organic layer 430 may function as the spacer.

The common electrode 210 is deposited on the upper insulating substrate 200. The common electrode 210 includes the transparent conductive material. Examples of the transparent conductive material that can be used for the common electrode 210 include indium tin oxide (ITO), indium zinc oxide (IZO).

In FIGS. 23 to 32, the aluminum complex oxide layer is on the aluminum line to prevent a corrosion of the aluminum line, thereby increasing a yield of the LCD device.

According to the present invention, the passivation layer is formed through the dipping process to decrease a defect of the display device.

A power consumption of the dipping process is greatly smaller than that of electrochemical method, thereby decreasing a manufacturing cost of the display device. In addition, an additional masking for the electrochemical method is unnecessary, thereby simplifying the manufacturing process. The complex oxide exhibits excellent insulative properties. Furthermore, metal atoms in the complex oxide layer provide repassivation characteristics, thereby increasing a corrosion resistance of the metal line of the display device.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A display device comprising: a substrate;
a metal layer formed on the substrate and including a top surface and a side surface, wherein the metal layer comprises aluminum or an aluminum alloy;

an insulating layer covering the metal layer; and
an aluminum complex oxide layer disposed between the top and side surfaces of the metal layer and the insulating layer, wherein the aluminum complex oxide layer is formed by applying to the metal layer a coating solution that comprises at least one selected from the group consisting of zirconium, tungsten, chromium and molybdenum.

2. The display device of claim 1, wherein the insulating layer comprises a silicon nitride layer on the aluminum complex oxide layer.

3. The display device of claim 1, wherein the metal layer comprises a gate line, a data line or both a gate line and a data line.

* * * * *